US012763301B2

(12) United States Patent
Nguyen et al.

(10) Patent No.: US 12,763,301 B2
(45) Date of Patent: Oct. 13, 2026

(54) CAPACITANCE AS CONTROL OF POWER APPLIED BY A BIAS-POWER-SUPPLY

(71) Applicant: Advanced Energy Industries, Inc., Denver, CO (US)

(72) Inventors: Hien Minh Nguyen, Longmont, CO (US); Daniel Carter, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 847 days.

(21) Appl. No.: 18/096,478

(22) Filed: Jan. 12, 2023

(65) Prior Publication Data

US 2024/0242945 A1 Jul. 18, 2024

(51) Int. Cl.
*H01J 37/32* (2006.01)

(52) U.S. Cl.
CPC .... *H01J 37/3299* (2013.01); *H01J 37/32935* (2013.01); *H01J 37/32174* (2013.01)

(58) Field of Classification Search
CPC ............. H01J 37/3299; H01J 37/32935; H01J 37/2174
USPC .......................................................... 320/132
See application file for complete search history.

(56) References Cited

U.S. PATENT DOCUMENTS 1,055,412 A 3/1913 Megill
4,622,094 A 11/1986 Otsubo
4,693,805 A 9/1987 Quazi
4,891,118 A 1/1990 Ooiwa et al.
4,963,239 A 10/1990 Shimamura et al.
5,057,185 A 10/1991 Thomas, III et al.
5,156,703 A 10/1992 Oechsner
5,160,397 A 11/1992 Doki et al.
5,179,264 A 1/1993 Cuomo et al.
5,242,561 A 9/1993 Sato
5,247,669 A 9/1993 Abraham et al.
5,332,880 A 7/1994 Kubota et al.
5,410,691 A 4/1995 Taylor
(Continued)

FOREIGN PATENT DOCUMENTS

CN 1451172 A 10/2003
CN 1839459 A 9/2006
(Continued)

OTHER PUBLICATIONS

Office Action received for Korean Patent Application Serial No. 1020147004544 dated Feb. 3, 2016, 13 pages.
(Continued)

*Primary Examiner* — Alexis B Pacheco
(74) *Attorney, Agent, or Firm* — NOD Law PC

(57) ABSTRACT

A bias supply system and methods are disclosed. The bias supply system comprises an output node, a return node, and a bias supply configured to apply an asymmetric periodic voltage waveform between the output node and the return node. A variable capacitance is coupled between the output node and the return node, and a controller is coupled to the variable capacitance. The controller is configured to receive a setting that defines a slope of a workpiece voltage, monitor electrical parameters at the output node to obtain an indication of an actual slope of the workpiece voltage, and control the variable capacitance so the actual slope of the workpiece voltage approaches the slope defined by the setting.

20 Claims, 14 Drawing Sheets

(56) References Cited

U.S. PATENT DOCUMENTS 5,415,718 A 5/1995 Ohmi et al.
5,427,669 A 6/1995 Drummond
5,487,785 A 1/1996 Horike et al.
5,517,084 A 5/1996 Leung
5,535,906 A 7/1996 Drummond
5,556,501 A 9/1996 Collins et al.
5,705,931 A 1/1998 Klick
5,767,628 A 6/1998 Keller et al.
5,770,972 A 6/1998 Freuler et al.
5,859,428 A 1/1999 Fruchtman
5,907,221 A 5/1999 Sato et al.
5,936,481 A 8/1999 Fujii
5,983,828 A 11/1999 Savas
6,030,667 A 2/2000 Nakagawa et al.
6,041,734 A * 3/2000 Raoux ............... H01J 37/32082 156/345.44
6,051,114 A 4/2000 Yao et al.
6,110,287 A 8/2000 Arai et al.
6,129,806 A 10/2000 Kaji et al.
6,156,667 A 12/2000 Jewett
6,162,709 A 12/2000 Raoux et al.
6,180,019 B1 1/2001 Kazumi et al.
6,201,208 B1 3/2001 Wendt et al.
6,273,022 B1 8/2001 Pu et al.
6,288,493 B1 9/2001 Lee et al.
6,291,938 B1 9/2001 Jewett et al.
6,313,583 B1 11/2001 Arita et al.
6,326,584 B1 12/2001 Jewett et al.
6,333,738 B1 12/2001 Ide
6,392,210 B1 5/2002 Jewett et al.
6,463,875 B1 10/2002 Chen et al.
6,478,924 B1 11/2002 Shamouilian et al.
6,507,155 B1 1/2003 Barnes et al.
6,544,895 B1 4/2003 Donohoe
6,568,346 B2 5/2003 Pu et al.
6,583,572 B2 6/2003 Veltrop et al.
6,617,794 B2 9/2003 Barnes et al.
6,621,674 B1 9/2003 Zahiringer et al.
6,646,385 B2 11/2003 Howald et al.
6,685,798 B1 2/2004 Howald et al.
6,694,915 B1 2/2004 Howald et al.
6,707,051 B2 3/2004 Shun'ko
6,714,033 B1 3/2004 Makhratchev et al.
6,724,148 B1 4/2004 Gonzalez et al.
6,756,737 B2 6/2004 Doi et al.
6,777,037 B2 8/2004 Sumiya et al.
6,794,301 B2 9/2004 Savas
6,819,096 B2 11/2004 Gonzalez et al.
6,822,396 B2 11/2004 Gonzalez et al.
6,863,018 B2 3/2005 Koizumi et al.
6,872,289 B2 3/2005 Mizuno et al.
6,885,153 B2 4/2005 Quon
6,885,453 B2 4/2005 Kaufmann
6,893,533 B2 5/2005 Holland et al.
6,913,938 B2 7/2005 Shanmugasundram et al.
6,920,312 B1 7/2005 Benjamin
6,924,455 B1 8/2005 Chen et al.
6,927,358 B2 8/2005 Gonzalez et al.
6,943,317 B1 9/2005 Ilic et al.
6,946,063 B1 9/2005 Gonzalez et al.
6,984,198 B2 1/2006 Krishnamurthy et al.
7,005,845 B1 2/2006 Gonzalez et al.
7,019,253 B2 3/2006 Johnson et al.
7,038,399 B2 5/2006 Lys et al.
7,046,524 B2 5/2006 Hoffman et al.
7,050,022 B2 5/2006 Kigo et al.
7,059,267 B2 6/2006 Hedberg et al.
7,096,819 B2 8/2006 Chen et al.
7,122,965 B2 10/2006 Goodman
7,132,618 B2 11/2006 Hoffman et al.
7,144,131 B2 12/2006 Rains
7,145,125 B2 12/2006 May et al.
7,201,936 B2 4/2007 Schwarm et al.
7,245,084 B1 7/2007 Gonzalez et al.
7,253,117 B2 8/2007 Donohoe
7,292,047 B2 11/2007 Tanaka et al.
7,297,637 B2 11/2007 Hedberg et al.
7,352,138 B2 4/2008 Lys et al.
7,373,899 B2 5/2008 Sumiya et al.
7,468,494 B2 12/2008 Gonzalez et al.
7,520,956 B2 4/2009 Samukawa et al.
7,528,386 B2 5/2009 Ruzic et al.
7,645,357 B2 1/2010 Paterson et al.
7,725,208 B2 5/2010 Shanmugasundram et al.
7,737,702 B2 6/2010 Pipitone
7,764,140 B2 7/2010 Nagarkatti et al.
7,768,477 B2 8/2010 Jung et al.
7,777,179 B2 8/2010 Chen et al.
7,783,375 B2 8/2010 Shanmugasundram et al.
7,811,939 B2 10/2010 Kushibiki et al.
7,847,247 B2 12/2010 Denpoh
7,928,664 B2 4/2011 Beland
8,012,306 B2 9/2011 Dhindsa
8,040,068 B2 10/2011 Coumou et al.
8,103,492 B2 1/2012 Brcka
8,140,292 B2 3/2012 Wendt
8,169,595 B2 5/2012 Schriever et al.
8,264,154 B2 9/2012 Banner et al.
8,319,436 B2 11/2012 Carter et al.
8,329,054 B2 12/2012 Ichino et al.
8,334,657 B2 12/2012 Xia
8,357,264 B2 1/2013 Shannon et al.
8,404,598 B2 3/2013 Liao et al.
8,409,398 B2 4/2013 Brcka
8,475,673 B2 7/2013 Edelberg
8,575,843 B2 11/2013 Moore et al.
8,641,916 B2 2/2014 Yatsuda et al.
8,674,606 B2 3/2014 Carter et al.
8,675,378 B2 3/2014 Beland
8,698,107 B2 4/2014 Godet et al.
8,742,669 B2 6/2014 Carter et al.
8,801,950 B2 8/2014 Lee
8,821,684 B2 9/2014 Ui et al.
8,900,402 B2 12/2014 Holland et al.
9,088,267 B2 7/2015 Blackburn et al.
9,105,447 B2 8/2015 Brouk et al.
9,114,666 B2 8/2015 Valcore, Jr. et al.
9,123,509 B2 9/2015 Papasouliotis et al.
9,177,756 B2 11/2015 Holland et al.
9,208,992 B2 12/2015 Brouk et al.
9,210,790 B2 12/2015 Hoffman et al.
9,226,380 B2 * 12/2015 Finley ................. H01J 37/3444
9,275,836 B2 3/2016 Himori
9,283,635 B2 3/2016 Peters
9,287,086 B2 3/2016 Brouk et al.
9,287,092 B2 3/2016 Brouk et al.
9,305,803 B2 4/2016 Morimoto et al.
9,309,594 B2 4/2016 Hoffman et al.
9,362,089 B2 6/2016 Brouk et al.
9,378,931 B2 6/2016 Kwon et al.
9,390,893 B2 7/2016 Valcore, Jr. et al.
9,425,029 B2 8/2016 Muto et al.
9,435,029 B2 9/2016 Brouk et al.
9,478,397 B2 10/2016 Blackburn et al.
9,536,749 B2 1/2017 Marakhtanov et al.
9,593,421 B2 3/2017 Baek et al.
9,595,424 B2 3/2017 Marakhtanov et al.
9,604,877 B2 3/2017 Veerasamy et al.
9,667,211 B1 * 5/2017 Wyse ........................ H03F 1/22
9,685,297 B2 6/2017 Carter et al.
9,754,767 B2 9/2017 Kawasaki
9,754,768 B2 9/2017 Yamada et al.
9,761,414 B2 9/2017 Marakhtanov et al.
9,761,419 B2 9/2017 Nagami
9,767,988 B2 9/2017 Brouk et al.
9,788,405 B2 10/2017 Kawasaki et al.
9,818,584 B2 11/2017 Miller et al.
9,872,373 B1 1/2018 Shimizu et al.
9,892,888 B2 2/2018 Baek et al.
10,355,582 B2 7/2019 Braginsky et al.
10,448,494 B1 10/2019 Dorf et al.
10,448,495 B1 10/2019 Dorf et al.
10,555,412 B2 2/2020 Dorf et al.
10,565,563 B1 2/2020 Hays et al.

(56) References Cited

U.S. PATENT DOCUMENTS

| | | | | |
|---|---|---|---|---|
| 10,607,813 | B2 | 3/2020 | Fairbairn et al. | |
| 10,707,055 | B2 | 7/2020 | Shaw et al. | |
| 10,791,617 | B2 | 9/2020 | Dorf et al. | |
| 10,811,227 | B2 | 10/2020 | Van Zyl et al. | |
| 10,811,228 | B2 | 10/2020 | Van Zyl et al. | |
| 10,811,229 | B2 | 10/2020 | Van Zyl et al. | |
| 10,896,807 | B2 | 1/2021 | Fairbairn et al. | |
| 11,011,349 | B2 | 5/2021 | Brouk et al. | |
| 11,144,688 | B1 | 10/2021 | Ershov et al. | |
| 11,189,454 | B2 | 11/2021 | Carter et al. | |
| 11,264,209 | B2 | 3/2022 | Van Zyl et al. | |
| 11,282,677 | B2 | 3/2022 | Shaw et al. | |
| 11,284,500 | B2 | 3/2022 | Dorf et al. | |
| 11,437,221 | B2 * | 9/2022 | Carter | H01J 37/32137 |
| 11,569,066 | B2 * | 1/2023 | Cubaynes | H01J 37/32128 |
| 11,615,941 | B2 * | 3/2023 | Brouk | H01J 37/32935 315/111.21 |
| 11,670,487 | B1 | 6/2023 | Nguyen | |
| 11,842,884 | B2 | 12/2023 | Shaw et al. | |
| 11,875,972 | B2 | 1/2024 | Driessen | |
| 11,887,812 | B2 | 1/2024 | Nguyen et al. | |
| 11,942,309 | B2 | 3/2024 | Singh | |
| 11,978,611 | B2 | 5/2024 | Carter et al. | |
| 11,978,613 | B2 | 5/2024 | Nguyen | |
| 12,009,179 | B2 | 6/2024 | Nguyen | |
| 12,034,405 | B2 * | 7/2024 | Yamamoto | H03B 5/368 |
| 12,046,448 | B2 | 7/2024 | Singh et al. | |
| 12,125,674 | B2 | 10/2024 | Carter | |
| 12,294,212 | B2 | 5/2025 | Alskran et al. | |
| 2001/0014540 | A1 | 8/2001 | Shan et al. | |
| 2002/0038631 | A1 | 4/2002 | Sumiya et al. | |
| 2002/0115301 | A1 | 8/2002 | Savas | |
| 2002/0144786 | A1 | 10/2002 | Chiang et al. | |
| 2002/0185228 | A1 | 12/2002 | Chen et al. | |
| 2003/0033116 | A1 | 2/2003 | Brcka et al. | |
| 2004/0007326 | A1 | 1/2004 | Roche et al. | |
| 2004/0094402 | A1 | 5/2004 | Gopalraja et al. | |
| 2004/0149218 | A1 | 8/2004 | Collins et al. | |
| 2004/0226657 | A1 | 11/2004 | Hoffman | |
| 2005/0090118 | A1 | 4/2005 | Shannon et al. | |
| 2005/0160985 | A1 | 7/2005 | Brcka | |
| 2005/0260354 | A1 | 11/2005 | Singh et al. | |
| 2006/0017388 | A1 | 1/2006 | Stevenson | |
| 2006/0066248 | A1 | 3/2006 | Chistyakov | |
| 2006/0088655 | A1 | 4/2006 | Collins et al. | |
| 2006/0130971 | A1 | 6/2006 | Chang et al. | |
| 2006/0171093 | A1 | 8/2006 | Ishimura et al. | |
| 2006/0221000 | A1 | 10/2006 | Moon | |
| 2006/0226786 | A1 | 10/2006 | Lin et al. | |
| 2006/0278518 | A1 | 12/2006 | Kouznetsov | |
| 2007/0121267 | A1 | 5/2007 | Kotani et al. | |
| 2007/0139112 | A1 | 6/2007 | Bocock et al. | |
| 2007/0139122 | A1 | 6/2007 | Nagarkatti et al. | |
| 2007/0186855 | A1 | 8/2007 | Dhindsa | |
| 2007/0186856 | A1 | 8/2007 | Yasui et al. | |
| 2007/0193975 | A1 | 8/2007 | Wilson | |
| 2007/0246163 | A1 | 10/2007 | Paterson et al. | |
| 2007/0251813 | A1 | 11/2007 | Ilic et al. | |
| 2008/0135400 | A1 | 6/2008 | Kadlec et al. | |
| 2009/0077150 | A1 | 3/2009 | Wendt | |
| 2009/0078678 | A1 | 3/2009 | Kojima et al. | |
| 2009/0183117 | A1 | 7/2009 | Chang | |
| 2009/0200494 | A1 | 8/2009 | Hatem et al. | |
| 2009/0255800 | A1 | 10/2009 | Koshimizu | |
| 2009/0298287 | A1 | 12/2009 | Shannon et al. | |
| 2010/0063787 | A1 | 3/2010 | Brcka | |
| 2010/0072172 | A1 | 3/2010 | Ui et al. | |
| 2010/0126893 | A1 | 5/2010 | Sinykin | |
| 2010/0154994 | A1 | 6/2010 | Fischer et al. | |
| 2010/0161353 | A1 | 6/2010 | Mayaud | |
| 2010/0208409 | A1 | 8/2010 | Bluck et al. | |
| 2010/0244802 | A1 | 9/2010 | Alexander | |
| 2010/0276273 | A1 | 11/2010 | Heckman et al. | |
| 2010/0283395 | A1 | 11/2010 | Van Zyl et al. | |
| 2010/0296977 | A1 | 11/2010 | Hancock | |
| 2010/0332011 | A1 | 12/2010 | Venugopal et al. | |
| 2011/0031217 | A1 | 2/2011 | Himori | |
| 2011/0038187 | A1 | 2/2011 | Horishita et al. | |
| 2011/0065161 | A1 | 3/2011 | Kwasinski et al. | |
| 2011/0089023 | A1 | 4/2011 | Tanaka et al. | |
| 2011/0095689 | A1 | 4/2011 | Gilbert | |
| 2011/0220491 | A1 | 9/2011 | Hilliard | |
| 2011/0223750 | A1 | 9/2011 | Hayash et al. | |
| 2011/0226617 | A1 | 9/2011 | Hofmann et al. | |
| 2011/0248634 | A1 | 10/2011 | Heil et al. | |
| 2011/0253672 | A1 | 10/2011 | Kamibayashi et al. | |
| 2011/0259851 | A1 | 10/2011 | Brouk et al. | |
| 2011/0286580 | A1 | 11/2011 | Beland | |
| 2011/0318933 | A1 | 12/2011 | Yatsuda et al. | |
| 2012/0000421 | A1 | 1/2012 | Miller et al. | |
| 2012/0052599 | A1 | 3/2012 | Brouk et al. | |
| 2012/0052689 | A1 | 3/2012 | Tokashiki | |
| 2012/0097524 | A1 | 4/2012 | Pipitone et al. | |
| 2012/0187844 | A1 | 7/2012 | Hoffman et al. | |
| 2012/0217221 | A1 | 8/2012 | Hoffman et al. | |
| 2012/0235976 | A1 | 9/2012 | Van Lier | |
| 2012/0318456 | A1 | 12/2012 | Brouk et al. | |
| 2012/0319584 | A1 | 12/2012 | Brouk et al. | |
| 2013/0001196 | A1 | 1/2013 | Hoffman et al. | |
| 2013/0006555 | A1 | 1/2013 | Roberg et al. | |
| 2013/0083566 | A1 | 4/2013 | Gaknoki et al. | |
| 2013/0122711 | A1 | 5/2013 | Marakhtanov et al. | |
| 2013/0136872 | A1 | 5/2013 | Booth et al. | |
| 2013/0206338 | A1 | 8/2013 | Tanaka | |
| 2013/0320853 | A1 | 12/2013 | Carter et al. | |
| 2013/0327272 | A1 | 12/2013 | Augustyniak et al. | |
| 2014/0061156 | A1 | 3/2014 | Brouk et al. | |
| 2014/0062303 | A1 | 3/2014 | Hoffman et al. | |
| 2014/0062495 | A1 | 3/2014 | Carter et al. | |
| 2014/0117861 | A1 | 5/2014 | Finley et al. | |
| 2014/0117872 | A1 | 5/2014 | Finley | |
| 2014/0148016 | A1 | 5/2014 | Kanazawa et al. | |
| 2014/0173158 | A1 | 6/2014 | Valcore, Jr. | |
| 2014/0231389 | A1 | 8/2014 | Nagami et al. | |
| 2014/0263182 | A1 | 9/2014 | Chen et al. | |
| 2014/0265910 | A1 | 9/2014 | Kobayashi et al. | |
| 2014/0302682 | A1 | 10/2014 | Muto et al. | |
| 2014/0305905 | A1 | 10/2014 | Yamada et al. | |
| 2014/0317563 | A1 | 10/2014 | O'Byrne | |
| 2015/0076112 | A1 | 3/2015 | Sriraman et al. | |
| 2015/0126037 | A1 | 5/2015 | Chen et al. | |
| 2015/0144596 | A1 | 5/2015 | Brouk et al. | |
| 2015/0170886 | A1 | 6/2015 | Morimoto et al. | |
| 2015/0222181 | A1 | 8/2015 | Coleman | |
| 2015/0250046 | A1 | 9/2015 | Habu | |
| 2015/0315698 | A1 | 11/2015 | Chistyakov | |
| 2015/0325413 | A1 | 11/2015 | Km et al. | |
| 2015/0348763 | A1 | 12/2015 | Mori et al. | |
| 2015/0371827 | A1 | 12/2015 | Godet et al. | |
| 2016/0020072 | A1 | 1/2016 | Brouk et al. | |
| 2016/0020108 | A1 | 1/2016 | Ranjan et al. | |
| 2016/0027616 | A1 | 1/2016 | Ramaswamy et al. | |
| 2016/0053017 | A1 | 2/2016 | Orentas et al. | |
| 2016/0056017 | A1 | 2/2016 | Kim et al. | |
| 2016/0064247 | A1 | 3/2016 | Tomura et al. | |
| 2016/0079037 | A1 | 3/2016 | Hirano et al. | |
| 2016/0126068 | A1 | 5/2016 | Lee et al. | |
| 2016/0126069 | A1 | 5/2016 | Kwon et al. | |
| 2016/0240353 | A1 | 8/2016 | Nagami | |
| 2016/0351375 | A1 | 12/2016 | Valcore, Jr. et al. | |
| 2017/0018411 | A1 | 1/2017 | Sriraman et al. | |
| 2017/0029941 | A1 | 2/2017 | Allen et al. | |
| 2017/0053820 | A1 | 2/2017 | Bosch et al. | |
| 2017/0062190 | A1 | 3/2017 | Lee et al. | |
| 2017/0099723 | A1 | 4/2017 | Nagami et al. | |
| 2017/0154781 | A1 | 6/2017 | Ranjan et al. | |
| 2017/0256381 | A1 | 9/2017 | Denpoh | |
| 2017/0278665 | A1 | 9/2017 | Carter et al. | |
| 2017/0286389 | A1 | 10/2017 | Ceneviva et al. | |
| 2017/0345620 | A1 | 11/2017 | Coumou et al. | |
| 2017/0358431 | A1 | 12/2017 | Dorf et al. | |
| 2018/0005802 | A1 | 1/2018 | Chen et al. | |
| 2018/0019100 | A1 | 1/2018 | Brouk et al. | |
| 2018/0047573 | A1 | 2/2018 | Tanaka et al. | |

(56) References Cited

U.S. PATENT DOCUMENTS

| | | | |
|---|---|---|---|
| 2018/0082824 | A1 | 3/2018 | Likhanskii et al. |
| 2018/0166249 | A1 | 6/2018 | Dorf et al. |
| 2018/0226225 | A1 | 8/2018 | Koh et al. |
| 2018/0233321 | A1 | 8/2018 | Caron |
| 2018/0287484 | A1 | 10/2018 | Braginsky et al. |
| 2018/0342903 | A1 | 11/2018 | Luu et al. |
| 2018/0373885 | A1 | 12/2018 | Arad et al. |
| 2019/0035606 | A1 | 1/2019 | Yoo et al. |
| 2019/0066979 | A1 | 2/2019 | Shoeb et al. |
| 2019/0131110 | A1* | 5/2019 | Ziemba ............. H01J 37/32146 |
| 2019/0157040 | A1 | 5/2019 | Fairbairn et al. |
| 2019/0157041 | A1 | 5/2019 | Zyl et al. |
| 2019/0157042 | A1 | 5/2019 | Van Zyl et al. |
| 2019/0157043 | A1 | 5/2019 | Shaw et al. |
| 2019/0172685 | A1 | 6/2019 | Van Zyl et al. |
| 2019/0180982 | A1 | 6/2019 | Brouk et al. |
| 2019/0273496 | A1 | 9/2019 | van Zyl |
| 2019/0316249 | A1* | 10/2019 | Abraham ................ C23C 14/35 |
| 2020/0020510 | A1 | 1/2020 | Shoeb et al. |
| 2020/0090905 | A1 | 3/2020 | Brouk et al. |
| 2020/0111644 | A1 | 4/2020 | Long et al. |
| 2020/0135527 | A1 | 4/2020 | Sung et al. |
| 2020/0203128 | A1 | 6/2020 | Fairbairn et al. |
| 2020/0266036 | A1 | 8/2020 | Aoki et al. |
| 2020/0294642 | A1 | 9/2020 | Bostic et al. |
| 2020/0313567 | A1 | 10/2020 | Porter et al. |
| 2020/0357607 | A1 | 11/2020 | Ziemba et al. |
| 2020/0357658 | A1 | 11/2020 | Nagami et al. |
| 2021/0005428 | A1 | 1/2021 | Shaw et al. |
| 2021/0013006 | A1 | 1/2021 | Nguyen et al. |
| 2021/0035225 | A1 | 2/2021 | Simpson et al. |
| 2021/0042516 | A1 | 2/2021 | Panakkal |
| 2021/0066017 | A1 | 3/2021 | Chang et al. |
| 2021/0074513 | A1 | 3/2021 | Van Zyl et al. |
| 2021/0091767 | A1 | 3/2021 | Cairoli et al. |
| 2021/0118649 | A1 | 4/2021 | Huh et al. |
| 2021/0134562 | A1 | 5/2021 | Fairbairn et al. |
| 2021/0202209 | A1 | 7/2021 | Van Zyl et al. |
| 2021/0241996 | A1 | 8/2021 | Carter et al. |
| 2021/0327679 | A1 | 10/2021 | Carter et al. |
| 2021/0335579 | A1 | 10/2021 | Jang |
| 2021/0351007 | A1 | 11/2021 | Carter |
| 2022/0013330 | A1 | 1/2022 | Driessen et al. |
| 2022/0037121 | A1 | 2/2022 | Dorf et al. |
| 2022/0037122 | A1 | 2/2022 | Bowman et al. |
| 2022/0070984 | A1* | 3/2022 | Van Dijk ........... H05B 45/3725 |
| 2022/0116033 | A1 | 4/2022 | Miller et al. |
| 2022/0157555 | A1 | 5/2022 | Carter et al. |
| 2022/0223377 | A1 | 7/2022 | Driessen |
| 2022/0254610 | A1 | 8/2022 | Bhutta |
| 2022/0270856 | A1 | 8/2022 | Poulose et al. |
| 2022/0285131 | A1 | 9/2022 | Shaw et al. |
| 2022/0384149 | A1 | 12/2022 | Shi et al. |
| 2022/0393589 | A1 | 12/2022 | Maksimovic et al. |
| 2022/0415615 | A1 | 12/2022 | Cubaynes et al. |
| 2023/0050119 | A1 | 2/2023 | Martinez et al. |
| 2023/0050841 | A1 | 2/2023 | Nguyen |
| 2023/0064671 | A1 | 3/2023 | Alskran et al. |
| 2023/0116058 | A1 | 4/2023 | Carter et al. |
| 2023/0207264 | A1* | 6/2023 | Hasegawa ......... H01J 37/32174 307/52 |
| 2023/0238216 | A1 | 7/2023 | Singh et al. |
| 2023/0253183 | A1 | 8/2023 | Mavretic et al. |
| 2023/0253187 | A1 | 8/2023 | Singh |
| 2023/0268162 | A1 | 8/2023 | Van Zyl et al. |
| 2023/0343556 | A1 | 10/2023 | Nguyen |
| 2023/0369016 | A1 | 11/2023 | Carter et al. |
| 2023/0377839 | A1 | 11/2023 | Carter et al. |
| 2023/0377840 | A1 | 11/2023 | Carter et al. |
| 2023/0395354 | A1 | 12/2023 | Shaw et al. |
| 2023/0395355 | A1 | 12/2023 | Shaw et al. |
| 2024/0030001 | A1 | 1/2024 | Nguyen et al. |
| 2024/0055225 | A1 | 2/2024 | Brouk et al. |
| 2024/0055227 | A1* | 2/2024 | Ziemba ............. H01J 37/32146 |
| 2024/0071721 | A1 | 2/2024 | Brouk et al. |
| 2024/0079210 | A1 | 3/2024 | Nguyen |
| 2024/0154404 | A1 | 5/2024 | Alskran et al. |
| 2024/0194452 | A1 | 6/2024 | Singh |
| 2024/0282553 | A1* | 8/2024 | Zhang ............... H01J 37/32183 |
| 2024/0304419 | A1 | 9/2024 | Nguyen |
| 2024/0348225 | A1 | 10/2024 | Suh et al. |
| 2024/0355585 | A1 | 10/2024 | Burry et al. |
| 2024/0404788 | A1 | 12/2024 | Luu et al. |
| 2025/0166965 | A1 | 5/2025 | Carter |
| 2025/0174436 | A1 | 5/2025 | Radomski et al. |
| 2025/0253133 | A1* | 8/2025 | Ziemba ............. H01J 37/32146 |
| 2025/0259822 | A1* | 8/2025 | Ziemba ............. H01J 37/32128 |
| 2025/0316451 | A1 | 10/2025 | Brouk et al. |

FOREIGN PATENT DOCUMENTS

| | | | |
|---|---|---|---|
| CN | 101685772 | A | 3/2010 |
| CN | 201465987 | U | 5/2010 |
| CN | 101835334 | A | 9/2010 |
| CN | 101978461 | A | 2/2011 |
| CN | 101990353 | A | 3/2011 |
| CN | 102217045 | A | 10/2011 |
| CN | 102405512 | A | 4/2012 |
| CN | 105097404 | A | 11/2015 |
| CN | 106537776 | A | 3/2017 |
| CN | 206272512 | U | 6/2017 |
| CN | 106920729 | A | 7/2017 |
| CN | 107005169 | A | 8/2017 |
| CN | 111788655 | A | 10/2020 |
| CN | 114222958 | A | 3/2022 |
| DE | 19912981 | C1 | 12/2000 |
| EP | 0 383 570 | A2 | 8/1990 |
| EP | 1 978 542 | A1 | 10/2008 |
| EP | 1 129 481 | B1 | 2/2012 |
| EP | 3167549 | B1 | 3/2019 |
| GB | 2 382 459 | A | 5/2003 |
| GB | 2 400 613 | A | 10/2004 |
| JP | 60-126832 | A | 7/1985 |
| JP | S62-125626 | A | 6/1987 |
| JP | 2141572 | A | 5/1990 |
| JP | H2-141572 | A | 5/1990 |
| JP | H4-193329 | A | 7/1992 |
| JP | H6-243992 | A | 9/1994 |
| JP | H9-293600 | A | 11/1997 |
| JP | H1-1087097 | A | 3/1999 |
| JP | H11298303 | A | 10/1999 |
| JP | 2001-237234 | A | 8/2001 |
| JP | 2001-525601 | A | 12/2001 |
| JP | 2002-050611 | A | 2/2002 |
| JP | 2003-133404 | A | 5/2003 |
| JP | 2004-085446 | A | 3/2004 |
| JP | 2004-193564 | A | 7/2004 |
| JP | 2005-527078 | A | 9/2005 |
| JP | 2005-534187 | A | 11/2005 |
| JP | 2006-147269 | A | 6/2006 |
| JP | 2006-286254 | A | 10/2006 |
| JP | 2007-311182 | A | 11/2007 |
| JP | 2007-336148 | A | 12/2007 |
| JP | 4016325 | B2 | 12/2007 |
| JP | 2008-501224 | A | 1/2008 |
| JP | 2008-157906 | A | 7/2008 |
| JP | 2009-071133 | A | 4/2009 |
| JP | 2009-514176 | A | 4/2009 |
| JP | 2009-540569 | A | 11/2009 |
| JP | 2010-103465 | A | 5/2010 |
| JP | 2010-219026 | A | 9/2010 |
| JP | 2010-238960 | A | 10/2010 |
| JP | 2011-519115 | A | 6/2011 |
| JP | 2011-222292 | A | 11/2011 |
| JP | 2012-079886 | A | 4/2012 |
| JP | 2012-104382 | A | 5/2012 |
| JP | 2015-115564 | A | 6/2015 |
| JP | 2015-534212 | A | 11/2015 |
| JP | 2015-534718 | A | 12/2015 |
| JP | 2016-500132 | A | 1/2016 |
| JP | 2017055100 | A | 3/2017 |
| JP | 6141478 | B2 | 6/2017 |
| JP | 6203476 | B2 | 9/2017 |
| JP | 2018-195588 | A | 12/2018 |

(56) References Cited

FOREIGN PATENT DOCUMENTS

| | | | |
|---|---|---|---|
| JP | 2019-523993 | A | 8/2019 |
| JP | 2019-197892 | A | 11/2019 |
| JP | 2021-503700 | A | 2/2021 |
| JP | 2021-503701 | A | 2/2021 |
| JP | 2021-503702 | A | 2/2021 |
| JP | 2022-541004 | A | 9/2022 |
| JP | 7736714 | B2 | 9/2025 |
| KR | 1020110016486 | A | 2/2011 |
| KR | 10-2012-0019428 | A | 3/2012 |
| KR | 10-1800623 | B1 | 11/2017 |
| TW | 514967 | B | 12/2002 |
| TW | 200610451 | A | 3/2006 |
| TW | 200811905 | A | 3/2008 |
| TW | 200915375 | A | 4/2009 |
| TW | 200952560 | A | 12/2009 |
| TW | 201009879 | A | 3/2010 |
| TW | 201116166 | A | 5/2011 |
| TW | 201142068 | A | 12/2011 |
| TW | 20120217221 | A | 8/2012 |
| TW | 201243812 | A | 11/2012 |
| TW | 201415522 | A | 4/2014 |
| TW | 201419371 | A | 5/2014 |
| TW | 201614097 | A | 4/2016 |
| TW | 201621974 | A | 6/2016 |
| TW | 201637069 | A | 10/2016 |
| TW | 202041106 | A | 11/2020 |
| TW | 202109611 | A | 3/2021 |
| TW | 202123283 | A | 6/2021 |
| TW | 202147753 | A | 12/2021 |
| WO | 91/09150 | A1 | 6/1991 |
| WO | 95/07544 | A1 | 3/1995 |
| WO | 97/49267 | A1 | 12/1997 |
| WO | 02/15222 | A2 | 2/2002 |
| WO | 02/19395 | A1 | 3/2002 |
| WO | 2004/012220 | A2 | 2/2004 |
| WO | 2004/114461 | A2 | 12/2004 |
| WO | 2010008006 | A1 | 1/2010 |
| WO | 2010/013476 | A1 | 2/2010 |
| WO | 2010/080421 | A2 | 7/2010 |
| WO | 2010126893 | A2 | 11/2010 |
| WO | 2012/007483 | A1 | 1/2012 |
| WO | 2012/030500 | A1 | 3/2012 |
| WO | 2012103101 | A1 | 8/2012 |
| WO | 2013/016619 | A1 | 1/2013 |
| WO | 2014/035889 | A1 | 3/2014 |
| WO | 2014/035897 | A1 | 3/2014 |
| WO | 2016/007960 | A1 | 1/2016 |
| WO | 2017/126184 | A1 | 7/2017 |
| WO | 2020077536 | | 4/2020 |
| WO | 2021/064110 | A1 | 4/2021 |
| WO | 2021068697 | | 4/2021 |
| WO | 2021068701 | | 4/2021 |
| WO | 2021/231035 | A1 | 11/2021 |
| WO | 2022/013017 | A1 | 1/2022 |
| WO | 2022/013018 | A1 | 1/2022 |

OTHER PUBLICATIONS

Office Action received for Korean Patent Application Serial No. 1020157006726 dated Feb. 19, 2018, 10 pages.
Office Action received for Korean Patent Application Serial No. 1020157007273 dated Jan. 30, 2018, 8 pages.
Office Action received for Korean Patent Application Serial No. 1020157007516 dated Feb. 15, 2017, 18 pages.
Office Action received for Taiwan Patent Application Serial No. 107140922 dated Feb. 1, 2021, 9 pages.
Office Action received for Taiwan Patent Application Serial No. 110136912 dated Feb. 23, 2022, 10 pages.
Office Action received for Taiwanese Patent Application Serial No. 102130565 dated Apr. 11, 2016, 2 pages.
Office Action received for Taiwanese Patent Application Serial No. 099113815 dated Jan. 27, 2014, 6 pages.
Office Action received for Taiwanese Patent Application Serial No. 099113815 dated Jun. 18, 2014, 5 pages.
Office Action received for Taiwanese Patent Application Serial No. 101127182 dated Aug. 11, 2014, 11 pages.
Office Action received for Taiwanese Patent Application Serial No. 102130565 dated Aug. 20, 2015, 4 pages.
Office Action received for Taiwanese Patent Application Serial No. 102130565 dated Jul. 14, 2015, 4 pages.
Office Action received for Taiwanese Patent Application Serial No. 102130984 dated Feb. 19, 2016, 4 pages.
Office Action received for Taiwanese Patent Application Serial No. 107140924 dated Apr. 28, 2020, 14 pages.
Office Action Received for Taiwanese Patent Application Serial No. 107140924 dated Jan. 15, 2021, 12 pages.
Office Action received for Taiwanese Patent Application Serial No. 107140926 dated May 28, 2020, 12 pages.
Office Action received for Taiwanese U.S. Appl. No. 10/714,924 dated Aug. 18, 2021, 5 pages.
Office Action received for Taiwanese Patent Application Serial No. Re: Taiwan Patent Application No. 110111617 dated Jun. 30, 2022, 8 pages.
Office Action rereceived for Japanese Patent Application Serial No. 2012508593 dated Sep. 11, 2013, 7 pages.
Ohachi, T., et al., "Measurement of Nitrogen Atomic Flux for RF-MBE Growth of GaN and AlN on Si Substrates", J. of Crystal Growth, vol. 311, 2009, pp. 2987-2991.
Raoux, S., et al., "Remote Microwave Plasma Source for Cleaning Chemical Vapor Deposition Chambers; Technology for Reducing Global Warming Gas Emissions", J. Vac. Sci. Technol. B, vol. 17, No. 2, Mar./Apr. 1999, pp. 477-485.
Rauf, S., et al.., "Nonlinear Dynamics of Radio Frequency Plasma Processing Reactors Powered by Multifrequency Sources", IEEE Transactions on Plasma Science, vol. 27, No. 5, Oct. 5, 1999, pp. 1329-1338.
Requirement for Restriction received for U.S. Appl. No. 12/870,837 dated Dec. 19, 2012, 8 pages.
Requirement for Restriction received for U.S. Appl. No. 13/193,299 dated Aug. 8, 2013, 7 pages.
Requirement for Restriction received for U.S. Appl. No. 13/193,345 dated Jun. 6, 2013, 8 pages.
Requirement for Restriction received for U.S. Appl. No. 13/596,976 dated Feb. 23, 2015, 8 pages.
Requirement for Restriction received for U.S. Appl. No. 13/597,050 dated Jan. 27, 2015, 7 pages.
Requirement for Restriction received for U.S. Appl. No. 13/597,093 dated Mar. 23, 2015, 9 pages.
Requirement for Restriction received for U.S. Appl. No. 14/011,305 dated Aug. 15, 2014, 14 pages.
Requirement for Restriction received for U.S. Appl. No. 14/803,815 dated Nov. 17, 2017, 8 pages.
Requirement for Restriction received for U.S. Appl. No. 15/495,513 dated Nov. 29, 2019, 6 pages.
Requirement for Restriction received for U.S. Appl. No. 15/667,239 dated Dec. 23, 2019, 6 pages.
Requirement for Restriction received for U.S. Appl. No. 16/557,209 dated Sep. 21, 2021, 6 pages.
Requirement for Restriction received for U.S. Appl. No. 16/926,876 dated Apr. 29, 2022, 9 pages.
Second Office Action received for Chinese Patent Application Serial No. 201080003206.X dated May 23, 2014, 6 pages.
Second Office Action received for Chinese Patent Application Serial No. 201710704712.5 dated Sep. 27, 2019, 11 pages.
Second Office Action received for Chinese Patent Application Serial No. 201711336133.6 dated Jan. 6, 2020, 7 pages.
Silapunt, R., et al., "Ion Bombardment Energy Control for Selective Fluorocarbon Plasma Etching of Organosilicate Glass", J. Vac. Sci. Technol, vol. B 22, No. 2, 2004, pp. 826-831.
Specification for related U.S. Appl. No. 13/173,752, filed Jun. 30, 2011, 48 pages.
Specification for related U.S. Appl. No. 13/425,159, filed Mar. 20, 2012, 33 pages.
Third Office Action received for Chinese Patent Application Serial No. 201080003206.X dated Nov. 26, 2014, 6 pages.
Third Office Action received for Chinese Patent Application Serial No. 201710704712.5 dated Jan. 3, 2020, 8 pages.

(56) References Cited

OTHER PUBLICATIONS

Third Office Action received for Chinese Patent Application Serial No. 201711336133.6 dated Oct. 10, 2020, 21 pages.
Vahedi, V., et al., "Verification of Frequency Scaling Laws for Capacitive Radio-Frequency Discharges Using Two-Dimensional Simulations", Phys. Fluids B, , vol. 5, No. 7, Jul. 1993, pp. 2719-2729.
Wakeham, S.J., et al.., "Low Temperature Remote Plasma Sputtering of Indium Tin Oxide for Flexible Display Applications", Thin Solid Films, vol. 519, 2009, pp. 1355-1358.
Wang, S.B., et al., "Control of Ion Energy Distribution at Substrates During Plasma Processing", J. Applied Physics, vol. 88, No. 2, Jul. 15, 2000, pp. 643-646.
Wendt "Thomson Innovation Patent Export", Mar. 10, 2009, 10 pages.
Xiubo, et al., "Charging of Dielectric Substrate Materials During Plasma Immersion Ion Implantation", Nuclear Instruments and Methods in Physics Research B, vol. 187, 2002, pp. 485-491.
Yun, Y.B., et al., "Effects of Various Additive Gases on Chemical Dry Etching Rate Enhancement of Low-k SiOCH Layer in F2/Ar Remote Plasmas", Thin Solid Films, vol. 516, 2008, pp. 3549-3553.
Notice of Allowance received for U.S. Appl. No. 16/194,104 dated Mar. 27, 2020, 37 pages.
Non Final Office Action received for U.S. Appl. No. 13/596,976 dated Nov. 6, 2015, 77 pages.
Non Final Office Action received for U.S. Appl. No. 13/596,976 dated Nov. 25, 2016, 20 pages.
Non Final Office Action received for U.S. Appl. No. 13/597,032 dated Jun. 20, 2014, 42 pages.
Non Final Office Action received for U.S. Appl. No. 13/597,050 dated Jul. 17, 2015, 86 pages.
Non Final Office Action received for U.S. Appl. No. 13/597,093 dated Nov. 5, 2015, 76 pages.
Non Final Office Action received for U.S. Appl. No. 13/597,093 dated Nov. 10, 2016, 23 pages.
Non Final Office Action received for U.S. Appl. No. 14/011,305 dated Dec. 4, 2014, 28 pages.
Non Final Office Action received for U.S. Appl. No. 14/606,857 dated Apr. 8, 2015, 51 pages.
Non Final Office Action received for U.S. Appl. No. 14/740,955 dated Feb. 2, 2016, 16 pages.
Non Final Office Action received for U.S. Appl. No. 14/803,815 dated Jul. 3, 2018, 67 pages.
Non Final Office Action received for U.S. Appl. No. 15/667,239 dated Jun. 24, 2020, 131 pages.
Non Final Office Action received for U.S. Appl. No. 16/193,790 dated Sep. 4, 2019, 86 pages.
Non Final Office Action received for U.S. Appl. No. 16/194,104 dated Aug. 1, 2019, 83 pages.
Non Final Office Action received for U.S. Appl. No. 16/194,125 dated Dec. 12, 2019, 88 pages.
Non Final Office Action received for U.S. Appl. No. 16/278,822 dated Aug. 2, 2021, 107 pages.
Non Final Office Action received for U.S. Appl. No. 16/278,822 dated Sep. 14, 2022, 9 pages.
Non Final Office Action received for U.S. Appl. No. 16/557,209 dated May 12, 2022, 30 pages.
Non Final Office Action received for U.S. Appl. No. 16/926,876 dated Sep. 26, 2022, 7 pages.
Non Final Office Action received for U.S. Appl. No. 16/926,876 dated Sep. 29, 2022, 80 pages.
Non-Final Office Action received for U.S. Appl. No. 17/150,633 dated Nov. 24, 2021, 52 pages.
Non-Final Office Action received for U.S. Appl. No. 15/495,513 dated Jul. 2, 2020, 87 pages.
Non-Final Office Action received for U.S. Appl. No. 16/246,996 dated Dec. 12, 2019, 85 pages.
Non-Final Office Action received for U.S. Appl. No. 16/270,391 dated Dec. 12, 2019, 78 pages.
Non-Final Office Action received for U.S. Appl. No. 16/803,020 dated Apr. 22, 2020, 36 pages.
Non-Final Office Action received for U.S. Appl. No. 16/896,709 dated May 25, 2021, 50 pages.
Non-Final Office Action received for U.S. Appl. No. 17/031,027 dated Apr. 28, 2021, 29 pages.
Non-Final Office Action received for U.S. Appl. No. 17/171,164 dated Oct. 15, 2021, 59 pages.
Notice of Allowance received for U.S. Appl. No. 12/767,775 dated Jan. 22, 2016, 50 pages.
Notice of Allowance received for U.S. Appl. No. 12/870,837 dated Feb. 12, 2016, 6 pages.
Notice of Allowance received for U.S. Appl. No. 12/870,837 dated Jan. 20, 2016, 37 pages.
Notice of Allowance received for U.S. Appl. No. 13/193,299 dated Jul. 6, 2016, 6 pages.
Notice of Allowance received for U.S. Appl. No. 13/193,299 dated May 20, 2016, 9 pages.
Notice of Allowance received for U.S. Appl. No. 13/193,345 dated Feb. 4, 2016, 16 pages.
Notice of Allowance received for U.S. Appl. No. 13/193,345 dated Mar. 7, 2016, 8 pages.
Notice of Allowance received for U.S. Appl. No. 13/596,976 dated Jul. 31, 2017, 6 pages.
Notice of Allowance received for U.S. Appl. No. 13/596,976 dated May 8, 2017, 17 pages.
Notice of Allowance received for U.S. Appl. No. 13/596,976 dated May 17, 2017, 6 pages.
Notice of Allowance received for U.S. Appl. No. 13/597,032 dated Aug. 28, 2015, 41 pages.
Notice of Allowance received for U.S. Appl. No. 13/597,050 dated Apr. 13, 2016, 15 pages.
Notice of Allowance received for U.S. Appl. No. 13/597,050 dated Apr. 20, 2016, 6 pages.
Notice of Allowance received for U.S. Appl. No. 13/597,093 dated Apr. 19, 2017, 2 pages.
Notice of Allowance received for U.S. Appl. No. 13/597,093 dated Mar. 17, 2017, 13 pages.
Notice of Allowance received for U.S. Appl. No. 14/011,305 dated Jun. 5, 2015, 24 pages.
Notice of Allowance received for U.S. Appl. No. 14/606,857 dated Sep. 24, 2015, 31 pages.
Notice of Allowance received for U.S. Appl. No. 15/495,513 dated Jul. 26, 2021, 18 pages.
Notice of Allowance received for U.S. Appl. No. 15/495,513 dated Oct. 27, 2021, 8 pages.
Notice of Allowance received for U.S. Appl. No. 15/667,239 dated Jan. 13, 2021, 26 pages.
Notice of Allowance received for U.S. Appl. No. 16/193,790 dated Jan. 23, 2020, 16 pages.
Notice of Allowance received for U.S. Appl. No. 16/193,790 dated Nov. 20, 2019, 40 pages.
Notice of Allowance received for U.S. Appl. No. 16/194,104 dated Mar. 2, 2020, 55 pages.
Final Office Action received for U.S. Appl. No. 18/350,516, mailed on Aug. 7, 2025, 29 pages.
Final Office Action received for U.S. Appl. No. 18/670,168 dated Sep. 11, 2025, 6 pages.
International Preliminary Report on Patentability received for PCT Patent Application No. PCT/US2024/011334, mailed on Jul. 24, 2025, 7 pages.
International Search Report and Written Opinion received for PCT Patent Application No. PCT/US2025/040171, mailed on Oct. 8, 2025, 17 pages.
Non-Final Office Action received for U.S. Appl. No. 18/518,840 mailed on Sep. 23, 2025, 9 pages.
Non-Final Office Action received for U.S. Appl. No. 18/670,168 dated Aug. 29, 2025, 5 pages.
Notice of Allowance received for JP Patent Application Serial No. 2022-568414, dated Jul. 29, 2025, 4 pages.
Office Action received for European Application No. 24742051.6, mailed on Aug. 20, 2025, 3 pages.

(56) References Cited

OTHER PUBLICATIONS

Office Action received for Japanse Patent Application No. 2024-215046, mailed on Jun. 26, 2025, 3 pages (2 pages of original office action and 1 page of English Translation).
Extended European Search Report received for European Patent Application Serial No. 18877737.9 dated Aug. 25, 2021, 165 pages.
Extended European Search Report received for European Patent Application Serial No. 10770205.2 dated Jan. 30, 2013, 8 pages.
Extended European Search Report received for European Patent Application Serial No. 18877322.0 Sep. 14, 2021, 129 pages.
Extended European Search Report received for European Patent Application Serial No. 18878531.5 dated Sep. 1, 2021, 126 pages.
Final Office Action received for U.S. Appl. No. 17/150,633 dated Jul. 27, 2022, 48 pages.
Final Office Action received for U.S. Appl. No. 12/767,775 dated Dec. 15, 2014, 37 pages.
Final Office Action received for U.S. Appl. No. 12/767,775 dated Sep. 10, 2013, 30 pages.
Final Office Action received for U.S. Appl. No. 12/870,837 dated Dec. 20, 2013, 33 pages.
Final Office Action received for U.S. Appl. No. 13/193,299 dated Dec. 4, 2015, 30 pages.
Final Office Action received for U.S. Appl. No. 13/193,299 dated Sep. 26, 2014, 37 pages.
Final Office Action received for U.S. Appl. No. 13/193,345 dated Jan. 15, 2016, 33 pages.
Final Office Action received for U.S. Appl. No. 13/193,345 dated Jul. 7, 2014, 26 pages.
Final Office Action received for U.S. Appl. No. 13/596,976 dated Apr. 5, 2017, 23 pages.
Final Office Action received for U.S. Appl. No. 13/596,976 dated Jul. 1, 2016, 34 pages.
Final Office Action received for U.S. Appl. No. 13/597,032 dated Apr. 9, 2015, 32 pages.
Final Office Action received for U.S. Appl. No. 13/597,050 dated Mar. 10, 2016, 19 pages.
Final Office Action received for U.S. Appl. No. 13/597,093 dated Jul. 8, 2016, 25 pages.
Final Office Action received for U.S. Appl. No. 14/803,815 dated Mar. 12, 2019, 15 pages.
Final Office Action received for U.S. Appl. No. 15/495,513 dated Apr. 14, 2021, 20 pages.
Final Office Action received for U.S. Appl. No. 16/278,822 dated Feb. 15, 2022, 52 pages.
First Office Action received for Chinese Patent Application Serial No. 201080003206.X dated Sep. 4, 2013, 15 pages.
First Office Action received for Chinese Patent Application Serial No. 201180046783.1 dated Mar. 24, 2015, 18 pages.
First Office Action received for Chinese Patent Application Serial No. 201280047162.X dated Sep. 6, 2015, 18 pages.
First Office Action received for Chinese Patent Application Serial No. 20171074712.5 dated Feb. 22, 2019, 9 pages.
First Office Action received for Chinese Patent Application Serial No. 201711336133.6 dated Mar. 4, 2019, 16 pages.
Fourth Office Action received for Chinese Patent Application Serial No. 201080003206.X dated Jun. 10, 2015, 8 pages.
Fourth Office Action received for Chinese Patent Application Serial No. 201710704712.5 dated Apr. 1, 2020, 7 pages.
Gangoli, S.P., et al., "Production and transport chemistry of atomic fluorine in remote plasma source and cylindrical reaction chamber", J. Phys. D: Appl. Phys., vol. 40, Aug. 16, 2007, pp. 5140-5154.
George, M.A., et al., "Silicon Nitride Arc Thin Films by New Plasma Enhanced Chemical Vapor Deposition Source Technology", Article downloaded from www.generalplasma.com, Jul. 7, 2011, pp. 1-5.
Giangregorio, M.M., et al., "Role of Plasma Activation in Tailoring the Nanostructure of Multifunctional Oxides Thin3 Films", Applied Surface Sci., vol. 255, Sep. 10, 2008, pp. 5396-5400.
Heil, S.B.S., et al., "Deposition ofTiN and HfO2 in a Commercial 200mm Plasma Atomic Layer Deposition Reactor", J. Vac. Sci. Technol. A, Sep./Oct. 2007, Jul. 31, 2007, vol. 25, No. 5, pp. 1357-1366.
Honda, S., et al., "Hydrogenation of Polycrystalline Silicon Thin Films", Thin Solid Films, vol. 501, Oct. 5, 2005, pp. 144-148.
International Preliminary Report on Patentability Chapter I received for International PCT Application Serial No. PCT/US2020/041771 dated Jan. 27, 2022, 10 pages.
International Preliminary Report on Patentability received for International PCT Application Serial No. PCT/US2010/032582 dated Nov. 10, 2011, 8 pages.
International Preliminary Report on Patentability received for International PCT Application Serial No. PCT/US2011/047467 dated Mar. 14, 2013, 7 pages.
International Preliminary Report on Patentability received for International PCT Application Serial No. PCT/US2012/020219 dated Jul. 18, 2013, 7 pages.
International Preliminary Report on Patentability received for International PCT Application Serial No. PCT/US2012/048504 dated Feb. 6, 2014, 11 pages.
International Preliminary Report on Patentability received for International PCT Application Serial No. PCT/US2013/056634 dated Mar. 12, 2015, 7 pages.
International Preliminary Report on Patentability received for International PCT Application Serial No. PCT/US2013/056647 dated Mar. 12, 2015, 7 pages.
International Preliminary Report on Patentability received for International PCT Application Serial No. PCT/US2013/056657 dated Mar. 12, 2015, 8 pages.
International Preliminary Report on Patentability received for International PCT Application Serial No. PCT/US2013/056659 dated Mar. 12, 2015, 8 pages.
International Preliminary Report on Patentability received for International PCT Application Serial No. PCT/US2013/056851 dated Mar. 12, 2015, 8 pages.
International Preliminary Report On Patentability Received for International PCT Application Serial No. PCT/US2018/061653 dated May 28, 2020, 9 pages.
International Preliminary Report on Patentability received for International PCT Application Serial No. PCT/US2018/061671 dated May 28, 2020, 14 pages.
International Preliminary Report on Patentability received International Application Serial No. PCT/US2018/061575 dated May 28, 2020, 9 pages.
International Search Report and Writen Opinion received for International PCT Application Serial No. PCT/US2012/048504 dated Sep. 17, 2012, 13 pages.
International Search Report And Written Opinion received for International Application Serial No. PCT/US2020/027927 dated Sep. 17, 2021, 14 pages.
International Search Report and Written Opinion received for International PCT Application Serial No. PCT/US2010/032582 dated Feb. 21, 2011, 10 pages.
International Search Report and Written Opinion received for International PCT Application Serial No. PCT/US2011/047467 dated Nov. 24, 2011, 9 pages.
International Search Report and Written Opinion received for International PCT Application Serial No. PCT/US2012/022380 dated Mar. 14, 2012, 11 pages.
International Search Report and Written Opinion received for International PCT Application Serial No. PCT/US2012/029953 dated May 28, 2012, 11 pages.
International Search Report and Written Opinion received for International PCT Application Serial No. PCT/US2012/20219 dated Feb. 22, 2012, 10 pages.
International Search Report and Written Opinion received for International PCT Application Serial No. PCT/US2013/056634 dated Nov. 15, 2013, 10 pages.
International Search Report and Written Opinion received for International PCT Application Serial No. PCT/US2013/056647 dated Oct. 30, 2013, 10 pages.

(56) References Cited

OTHER PUBLICATIONS

International Search Report and Written Opinion received for International PCT Application Serial No. PCT/US2013/056657 dated Oct. 28, 2013, 11 pages.
International Search Report and Written Opinion received for International PCT Application Serial No. PCT/US2013/056659 dated Nov. 8, 2013, 11 pages.
International Search Report and Written Opinion received for International PCT Application Serial No. PCT/US2013/056851 dated Nov. 18, 2013, 11 pages.
International Search Report and Written Opinion received for International PCT Application Serial No. PCT/US2018/061575 dated Mar. 6, 2019, 12 pages.
International Search Report and Written Opinion received for International PCT Application Serial No. PCT/US2018/061653 dated Mar. 8, 2019, 10 pages.
International Search Report and Written Opinion received for International PCT Application Serial No. PCT/US2018/061671 dated Mar. 13, 2019, 17 pages.
International Search Report and Written Opinion received for International PCT Application Serial No. PCT/US2021/027927 dated Sep. 17, 2021, 9 pages.
International Search Report and Written Opinion received for International PCT Application Serial No. PCT/US2022/014888 dated Mar. 25, 2022, 18 pages.
International Search Report and Written Opinion received for International PCT Application Serial No. PCT/US2022/016278 dated May 17, 2022, 10 pages.
International Search Report and Written Opinion received for International PCT Application Serial No. PCT/US2022/016279 dated Jun. 9, 2022, 8 pages.
International Search Report and Written Opinion received for International PCT Application Serial No. PCT/US2022/040046 dated Oct. 27, 2022, 9 pages.
Jeon, M., et al., "Hydrogenated Amorphous Silicon Film as Intrinsic Passivation Layer Deposited at Various Temperatures using RF remote-PECVD technique", Current Applied Physics, vol. 10, No. 2010, Nov. 12, 2009, pp. S237-S240.
Kim, J.Y., et al., "Remote Plasma Enhanced Atomic Layer Deposition ofTiN Thin Films Using Metalorganic Precursor", J. Vac. Sci. Technol. A, vol. 22, No. 1, Jan./Feb. 2004, Nov. 13, 2003, pp. 8-12.
Krolak, M, "Matthew Krolak's MyElectricEngine.Com Megnetoplasmadynamic (MPD) Thruster Design", Webpage downloaded from http://myelectricengine.com/projects/mpdthruster/mpdthruster.html, Apr. 28, 2011, 7 pages.
Kuo, M.S., et al., "Influence of C4F8/Ar-based etching and H2-based remote plasma ashing processes on ultralow • Materials Modifications", J. Vac. Sci. Technol. B, vol. 28, No. 2, Mar./Apr. 2010, Mar. 19, 2010, pp. 284-294.
Non Final Office Action received for U.S. Appl. No. 12/767,775 dated Apr. 25, 2013, 28 pages.
Non Final Office Action received for U.S. Appl. No. 12/767,775 dated Jul. 1, 2014, 48 pages.
Non Final Office Action received for U.S. Appl. No. 12/767,775 dated Jun. 17, 2015, 28 pages.
Non Final Office Action received for U.S. Appl. No. 12/767,775 dated Oct. 17, 2012, 33 pages.
Non Final Office Action received for U.S. Appl. No. 12/870,837 dated Apr. 9, 2015, 40 pages.
Non Final Office Action received for U.S. Appl. No. 12/870,837 dated Mar. 22, 2013, 46 pages.
Non Final Office Action received for U.S. Appl. No. 13/193,299 dated Dec. 18, 2013, 43 pages.
Non Final Office Action received for U.S. Appl. No. 13/193,299 dated May 21, 2015, 24 pages.
Non Final Office Action received for U.S. Appl. No. 13/193,345 dated Apr. 16, 2015, 34 pages.
Non Final Office Action received for U.S. Appl. No. 13/193,345 dated Nov. 7, 2013, 36 pages.
Non Final Office Action received for U.S. Appl. No. 13/343,576 dated Nov. 13, 2014, 24 pages.
Ciccarello et al., "ASHP Guidelines on the Pharmacy and Therapeutics Committee and the Formulary System", American Journal of Health-System Pharmacy, vol. 78, No. 10, May 15, 2021, pp. 907-915.
Examination report for European Patent Application Serial No. 18877737.9 dated Jun. 13, 2023, 5 pages.
Extended European search report received for European Patent Application Serial No. 23209856.6 dated Feb. 15, 2024, 9 pages.
Extended Search Report received for European Patent Application Serial No. 23173938.4 dated Jul. 20, 2023, 7 pages.
Final Office Action received for U.S. Appl. No. 16/577,209 dated Feb. 1, 2023, 80 pages.
First Office Action received for Chinese Patent Application Serial No. 201880086817.1 dated Dec. 9, 2022, 25 pages.
First Office Action received for Chinese Patent Application Serial No. 202080057686 dated Feb. 28, 2023, 17 pages.
International Preliminary Report on Patentability received for International Application Serial No. PCT/US2022/04888 mailed on Aug. 24, 2023, 8 pages.
International Preliminary Report on Patentability received for International PCT Application Serial No. PCT/US2022/016279 dated Aug. 31, 2023, 6 pages.
International Search Report and Written Opinion received for International PCT Application Serial No. PCT/US2022/053703, Apr. 6, 2023, 10 Pages.
International Search Report and Written Opinion received for International PCT Application Serial No. PCT/US2022/053706 dated Apr. 3, 2023, 14 pages.
International Search Report and Written Opinion received for International PCT Application Serial No. PCT/US2022/053709 dated Apr. 4, 2023, 10 pages.
Non Final Office Action received for U.S. Appl. No. 16/557,209 dated Nov. 21, 2023, 91 pages.
Non Final Office Action received for U.S. Appl. No. 16/871,613 dated Nov. 3, 2023, 146 pages.
Non Final Office Action received for U.S. Appl. No. 17/692,880 dated Mar. 31, 2023, 122 pages.
Non Final Office Action received for U.S. Appl. No. 17/902,987 dated Nov. 15, 2023, 121 pages.
Non Final Office Action received for U.S. Appl. No. 18/198,788 dated Dec. 12, 2023, 22 pages.
Non Final Office Action received for U.S. Appl. No. 18/330,005 dated Mar. 1, 2024, 18 pages.
Non Final Office Action received for U.S. Appl. No. 18/330,005 dated Nov. 14, 2023, 23 pages.
Werble, Cole "Formularies, Health Policy Brief Series 11", Prescription Drug Pricing, Sep. 14, 2017, 4 pages.
Non-Final Rejection office action received for U.S. Appl. No. 18/318,861 dated Mar. 20, 2024, 50 pages.
Notice of Allowance received for U.S. Appl. No. 16/926,876 dated Feb. 17, 2023, 47 pages.
Notice of Allowance received for U.S. Appl. No. 16/926,876 dated May 19, 2023, 39 pages.
Notice of Allowance received for U.S. Appl. No. 17/584,921 dated Jan. 19, 2023, 83 pages.
Notice of Allowance received for U.S. Appl. No. 17/584,921 dated May 5, 2023, 4 pages.
Notice of Allowance received for U.S. Appl. No. 17/584,940 dated Dec. 12, 2023, 114 pages.
Notice of Allowance received for U.S. Appl. No. 17/584,992 dated Mar. 20, 2024, 113 pages.
Notice of Allowance received for U.S. Appl. No. 17/692,880 dated Aug. 15, 2023, 43 pages.
Notice of Allowance received for U.S. Appl. No. 17/692,880 dated Sep. 6, 2023, 12 pages.
Notice of Allowance received for U.S. Appl. No. 17/692,880 dated Sep. 27, 2023, 12 pages.
Second Office Action received for Chinese Patent Application Serial No. 201880086817.1 dated Aug. 31, 2023, 10 pages.
Notice of Allowance received for U.S. Appl. No. 18/141,448 dated Feb. 14, 2024, 22 pages.

(56) References Cited

OTHER PUBLICATIONS

Notice of Allowance received for U.S. Appl. No. 18/198,790 dated Mar. 4, 2024, 58 pages.
Notice of Reasons for Rejection received for Japanese Patent Application Serial No. 2020-545047 dated Nov. 1, 2022, 10 pages.
Notice of Reasons for Rejection received for Japanese Patent Application Serial No. 2020-545048 dated Nov. 14, 2023, 6 pages.
Office Action received for Taiwan Patent Application Serial No. 111150645, dated Oct. 18, 2023, 12 pages.
Requirement for Restriction received for U.S. Appl. No. 17/245,825 dated Mar. 18, 2024, 8 pages.
Requirement for Restriction received for U.S. Appl. No. 18/495,452 dated Mar. 18, 2024, 8 pages.
Notice of Allowance received for U.S. Appl. No. 18/198,790 dated Mar. 22, 2024, 12 pages.
Non Final Office Action received for U.S. Appl. No. 18/198,788 dated Apr. 15, 2024, 15 pages.
Non Final Office Action received for U.S. Appl. No. 17/528,268 dated Apr. 18, 2024, 127 pages.
Non Final Office Action received for U.S. Appl. No. 18/450,652 dated Apr. 1, 2024, 29 pages.
Non Final Office Action received for U.S. Appl. No. 17/181,382 dated May 9, 2024, 111 pages.
Non Final Office Action received for U.S. Appl. No. 18/450,635 dated Mar. 28, 2024, 58 pages.
Final Office Action received for U.S. Appl. No. 16/871,613 dated Apr. 4, 2024, 12 pages.
Requirement for Restriction received for U.S. Appl. No. 17/401,422 dated May 8, 2024, 4 pages.
International Search Report and Written Opinion received for International PCT Application Serial No. PCT/US2024/011334 dated Jun. 21, 2024, 16 pages.
Non Final Office Action received for U.S. Appl. No. 18/494,452 dated Jun. 28, 2024, 52 pages.
Final Office Action received for U.S. Appl. No. 18/330,005, Jun. 14, 2024, 17 pages.
Non Final Office Action received for U.S. Appl. No. 18/116,207 dated Aug. 12, 2024, 22 pages.
Notice of Allowance received for U.S. Appl. No. 16/194,125 dated Jun. 18, 2020, 42 pages.
Notice of Allowance received for U.S. Appl. No. 16/246,996 dated Jun. 18, 2020, 27 pages.
Notice of Allowance received for U.S. Appl. No. 16/270,391 dated Jun. 16, 2020, 36 pages.
Notice of Allowance received for U.S. Appl. No. 16/278,822 dated Dec. 1, 2022, 13 pages.
Notice of Allowance received for U.S. Appl. No. 16/803,020 dated Sep. 14, 2020, 100 pages.
Notice of Allowance received for U.S. Appl. No. 16/896,709 dated Nov. 17, 2021, 46 pages.
Notice of Allowance received for U.S. Appl. No. 17/031,027 dated Feb. 3, 2022, 8 pages.
Notice of Allowance received for U.S. Appl. No. 17/031,027 dated Oct. 20, 2021, 81 pages.
Notice of Allowance received for U.S. Appl. No. 17/150,633 dated Nov. 15, 2022, 42 pages.
Notice of Allowance received for U.S. Appl. No. 17/171,164 dated Jun. 8, 2022, 13 pages.
Notice of Allowance received for U.S. Appl. No. 17/171,164 dated May 4, 2022, 38 pages.
Notice of Allowance received for U.S. Appl. No. 17/584,921 dated Nov. 16, 2022, 9 pages.
Notice of Final Rejection received for Japanese Patent Application Serial No. 2013547731 dated Jul. 28, 2015, 13 pages.
Notice of Grounds for Rejection received for Korean Patent Application Serial No. 1020157007771 dated May 31, 2018, 4 pages.
Notice of Grounds for Rejection received for Korean Patent Application Serial No. 1020177033224 dated Aug. 6, 2018, 7 pages.
Notice of Grounds for Rejection received for Korean Patent Application Serial No. 1020187029468 dated Feb. 7, 2019, 6 pages.
Notice of Reasons for Rejection received for Japanese Patent Application Serial No. 2013547731 dated Sep. 30, 2014, 8 pages.
Notice of Reasons for Rejection received for Japanese Patent Application Serial No. 2017091857 dated Feb. 2, 2018, 10 pages.
Notice of Reasons for Rejection received for Japanese Patent Application Serial No. 2020081092 dated Apr. 1, 2021, 6 pages.
Notice of Reasons for Rejection received for Japanese Patent Application Serial No. 2020545048 dated Aug. 19, 2022, 12 pages.
Office Action received for Chinese Patent Application Serial No. 201180046783.1 dated Dec. 7, 2016, 9 pages.
Office Action received for Chinese Patent Application Serial No. 201180046783.1 dated Dec. 8, 2015, 9 pages.
Office Action received for Chinese Patent Application Serial No. 201180046783.1 dated May 17, 2016, 8 pages.
Office Action received for Chinese Patent Application Serial No. 201280047162.X dated Apr. 26, 2016, 7 pages.
Office Action received for Chinese Patent Application Serial No. 201280047162.X dated Oct. 24, 2016, 31 pages.
Office Action received for Chinese Patent Application Serial No. 201380056068.5 dated Jun. 12, 2017, 16 pages.
Office Action received for Chinese Patent Application Serial No. 201380056068.5 dated Oct. 17, 2016, 15 pages.
Office Action received for Chinese Patent Application Serial No. 201380056070.2 dated Apr. 2, 2018, 6 pages.
Office Action received for Chinese Patent Application Serial No. 201380056070.2 dated Aug. 15, 2016, 25 pages.
Office Action received for Chinese Patent Application Serial No. 201380056070.2 dated Jul. 11, 2017, 13 pages.
Office Action received for European Patent Application Serial No. 10770205.2 dated Nov. 2, 2017, 30 pages.
Office Action received for European Patent Application Serial No. 10770205.2 dated Oct. 22, 2019, 6 pages.
Office Action received for European Patent Application Serial No. 11822326.2 dated Apr. 3, 2017, 4 pages.
Office Action received for European Patent Application Serial No. 11822326.2 dated Feb. 27, 2018, 5 pages.
Office Action received for European Patent Application Serial No. 11822326.2 dated Oct. 18, 2018, 6 pages.
Office Action received for Japanese Patent Application Serial No. 2012508593 dated Apr. 19, 2013, 11 pages.
Office Action received for Japanese Patent Application Serial No. 2013527088 dated Apr. 21, 2015, 10 pages.
Office Action received for Japanese Patent Application Serial No. 2014523057 dated Apr. 21, 2015, 11 pages.
Office Action received for Japanese Patent Application Serial No. 2015529905 dated Aug. 22, 2017, 16 pages.
Office Action received for Japanese Patent Application Serial No. 2015529905 dated Aug. 24, 2017, 14 pages.
Office Action received for Japanese Patent Application Serial No. 2015529906 dated May 16, 2017, 13 pages.
Office Action received for Japanese Patent Application Serial No. 2015529939 dated Sep. 19, 2017, 19 pages.
Office Action received for Japanese Patent Application Serial No. 2016-043215 dated Jan. 25, 2017, 7 pages.
Office Action received for Japanese Patent Application Serial No. 2018081644 dated Apr. 16, 2019, 21 pages.
Office Action received for Japanese Patent Application Serial No. 2018138425 dated Mar. 24, 2020, 7 pages.
Office Action received for Japanese Patent Application Serial No. 2018138425 dated May 22, 2019, 10 pages.
Office Action received for Japanese Patent Application Serial No. 20205545044 dated Aug. 25, 2022, 6 pages.
Office Action received for Korean Patent Application Serial No. 1020117009075 dated Mar. 25, 2013, 2 pages.
Office Action received for Korean Patent Application Serial No. 1020137007594 dated Jul. 28, 2014, 2 pages.
Office Action received for Korean Patent Application Serial No. 1020137019332 dated May 29, 2015, 18 pages.
Japan Patent Office, Notice of Reasons for Rejection issued in JP Application No. 2022-568414, Oct. 10, 2024.
PCT, International Search Report and Written Opinion issued PCT/US2023/073153, Feb. 9, 2024, 18 pages.

(56) References Cited

OTHER PUBLICATIONS

Skibinski, Tomi Sweet, Non-final Office Action issued in U.S. Appl. No. 18/656,543, Nov. 15, 2024, 21 pages.
Yu, Yuechuan, Final Office Action issued in U.S. Appl. No. 18/318,861, Nov. 12, 2024, 95 pages.
Ford, Nathan K, Office Action issued in U.S. Appl. No. 17/401,422, Apr. 24, 2025, 100 pages.
PCT, International Search Report and Written Opinion issued in PCT/US2025/017119, Apr. 29, 2025, 20 pages.
Tahsin Faraz, Yuri G. P. Verstappen, Marcel A. Verheijen, Nicholas J. Chittock, Javier Escandon Lopez, Erik Heijdra, Wouter J. H. van Gennip, Wilhelmus M. M. Kessels, and Adriaan J. M. Mackus, Precise Ion energy Control with Tailored Waveform Biasing for Atomic Scale Processing, Dec. 7, 2020 Article, AIP Publishing.
Qihao Yu, Erik Lemmen, Korneel Wijnands, Bas Vermulst, A Switched-Mode Power Amplifier for Ion Energy Control in Plasma Etching, Article, Jan. 9, 2020, Institute of Electrical and Electronics Engineers.
Qihao Yu, Erik Lemmen, Korneel Wijnands, Bas Vermulst, Accurate Ion Energy Control in Plasma Processing by Switched-Mode Power Converter, article, Jan. 7, 2022, Institute of Electrical and electronics Engineers.
Diop et al., 10 kV SiC MOSFET Evaluation for Dielectric Barrier Discharge Transformerless Power Supply, Aug. 18, 2020, Plasma, vol. 3, No. 3, pp. 103-116.
EPO, Extended European Search Report issued in EP Application No. 22856600.6, May 12, 2025, 9 pages.
KIPO, Notice of Grounds for Rejection issued in KR Application No. 10-2022-7042658, Jul. 10, 2025, 26 pages.
Rueda et al., Series Resonant Inverter Efficiency Improvement with Valley Switching for Dielectric Barrier Discharges, IEEE 2019 IEEE 13th International Conference Onpower Electronics and Drive Systems, Toulouse, France, Jul. 9-12, 2019, 6 pages.
Skibinski, Tomi Sweet, Office Action issued U.S. Appl. No. 18/656,543, May 15, 2025, 33 pages.
Final Office Action received for U.S. Appl. No. 18/198,788 dated Aug. 12, 2024, 11 pages.
Final Office Action received for U.S. Appl. No. 16/557,209 dated Jul. 10, 2024, 46 pages.
Final Office Action received for U.S. Appl. No. 17/902,987 dated Jun. 12, 2024, 17 pages.
Notice of Allowance received for U.S. Appl. No. 17/902,987 dated Jul. 24, 2024, 13 pages.
Communication pursuant to Article 94(3) EPC received for European Patent Application Serial No. 18878531.5 dated Apr. 18, 2024, 6 pages.
Notice of Ground of Rejection received for Korean Patent Application Serial No. 10-2020-7017361 dated Mar. 27, 2024, 22 pages.
Notice of Final Rejection received for Japanese Patent Application Serial No. 2020-545048 dated Jun. 13, 2024, 6 pages.
Notice of Allowance received for U.S. Appl. No. 16/871,613 dated Jun. 20, 2024, 14 pages.
Notice of Allowance received for U.S. Appl. No. 16/871,613 dated Jul. 25, 2024, 6 pages.
Notice of Allowance received for U.S. Appl. No. 16/871,613 dated Aug. 21, 2024, 6 pages.
Office Action received for Taiwan Patent Application Serial No. 109123604 dated Jun. 24, 2024, 26 pages.
Extended European Search Report received for European Patent Application Serial No. 21803110.2 dated Jun. 6, 2024, 11 pages.
Notice of Reason of Rejection received for Japanese Patent Application Serial No. 2022-501232 dated May 29, 2024, 10 pages.
Notice of Allowance received for U.S. Appl. No. 18/450,635 dated Jul. 29, 2024, 45 pages.
International Preliminary Report on Patentability received for International PCT Application Serial No. PCT/US2022/053703 dated Aug. 8, 2024, 7 pages.
International Preliminary Report on Patentability received for International PCT Application Serial No. PCT/US2022/053706 dated Aug. 8, 2024, 8 pages.
International Preliminary Report on Patentability received for International PCT Application Serial No. PCT/US2022/053709 dated Aug. 8, 2024, 7 pages.
Ferdous, Zannatul, Office action issued in U.S. Appl. No. 18/350,516, Mar. 20, 2025, 133 pages.
KIPO, Notice of Grounds for Rejection issued in Korean Patent Application No. 10-2022-7004812, Mar. 12, 2025, 15 pages.
PCT, International Preliminary Report on Patentability issued in PCT/US2023/073153, Mar. 13, 2025, 9 pages.
PCT, International Search Report and Written Opinion issued in PCT/US2024/055362, Jan. 14, 2025, 18 pages.
Yu, Yuechuan, Office Action issued in U.S. Appl. No. 18/318,861, Feb. 20, 2025, 102 pages.
Lee, Jye-June, Office Action issued in U.S. Appl. No. 18/742,088, Jan. 16, 2025, 36 pages.
Final Office Action received for U.S. Appl. No. 18/518,840, mailed on Apr. 3, 2026, 11 pages.
MOIP, Notice of Grounds for Rejection issued in Korean Patent Application No. 10-2024-7008015, on Feb. 24, 2026, 13 pages.
Non-Final Office Action received for U.S. Appl. No. 17/401,422, mailed on May 5, 2026, 8 pages.
Non-Final Office Action received for U.S. Appl. No. 18/591,261, mailed on May 7, 2026, 13 pages.
Non-Final Office Action received for U.S. Appl. No. 18/670,168, mailed on Apr. 1, 2026, 13 pages.
Non-Final Office Action received for U.S. Appl. No. 18/830,709, mailed on May 1, 2026, 10 pages.
Notice of Allowance received for U.S. Appl. No. 18/794,876, mailed on Jun. 9, 2026, 2 pages.
Notice of Allowance received for U.S. Appl. No. 18/794,876, mailed on May 22, 2026, 15 pages.
Notice of Allowance received for U.S. Appl. No. 18/946,058, mailed on Jun. 2, 2026, 8 pages.
Office Action received for Korean Patent Application No. 10-2024-7008015 , mailed on Feb. 24, 2026, 13 pages (7 pages of original office action and 6 pages of English Translation).
Office Action received for Korean Patent Application No. 10-2024-7028517, mailed on Jun. 4, 2026, 7 pages (4 pages of original office action and 3 pages of English Translation).
Office Action received for Malaysia Patent Application No. PI2022006188, mailed on Oct. 3, 2025, 4 pages.
Office Action received for Taiwanese Patent Application No. 111130474, mailed on Apr. 13, 2026, 20 pages (9 pages of English Translation and 11 pages of Original Document).
Requirement for Restriction/Election received for U.S. Appl. No. 18/584,816, mailed on May 13, 2026, 8 pages.
Final Office Action received for U.S. Appl. No. 17/401,422, mailed on Dec. 3, 2025, 7 pages.
International Search Report and Written Opinion received for PCT Patent Application No. PCT/US2025/055206, mailed on Feb. 3, 2026, 20 pages.
Non-Final Office Action received for U.S. Appl. No. 18/794,876, mailed on Dec. 17, 2025, 17 pages.
Non-Final Office Action received for U.S. Appl. No. 18/946,058, mailed on Jan. 29, 2026, 16 pages.
Notice of Allowance received for U.S. Appl. No. 18/350,516, mailed on Jan. 16, 2026, 9 pages.
Notice of Allowance received for U.S. Appl. No. 18/670,168, mailed on Nov. 25, 2025, 7 pages.
Office Action received for Taiwanese Patent Application No. 114119273, mailed on Jan. 8, 2026, 20 pages (10 pages of English Translation and 10 pages of Original Document).
Bruno, G., et al., “Real Time Ellipsometry for Monitoring Plasma-Assisted Epitaxial Growth of GaN”, Applied Surface Sci., vol. 253, 2006, pp. 219-223.
Bruno, James, “Use of Simulation for Examining the Effects of Guessing Upon Knowledge Assessment on Standardized Tests”, “Conference Proceedings of the 10th Conference on Winter Simulation, Miami, FL”, 1978, vol. 2, pp. 759-765.
Bryns, B., et al., “A Vhf Driven Coaxial Atmospheric Air Plasma: Electrical and Optical Characterization”, Dep’t of Nuclear Engr., 2011, pp. 1-18.

(56) References Cited

OTHER PUBLICATIONS

Buzzi, F.L., et al., “Energy Distribution of Bombarding lons in Plasma Etching of Dielectrics”, “AVS 54th International Symposium”, Oct. 15, 2007, 18 pages.
Communication pursuant to Article 94(3) EPC received for European Patent Application Serial No. 10770205.2 dated Jun. 8, 2021, 6 pages.
Communication Pursuant to Article 94(3) EPC received for European Patent Application Serial No. 10770205.2 dated Oct. 23, 2020, 4 pages.
Decision of Rejection received for Chinese Patent Application Serial No. 201710704712.5 dated Aug. 10, 2020, 8 pages.
Decision of Rejection received for Korean Patent Application Serial No. 1020137019332 dated Jan. 20, 2016, 6 pages.
Emsellem, G., “Electrodeless Plasma Thruster Design Characteristics”, 41st Joint Propulsion Conference, Jul. 11, 2005, 22 pages.
European Search Report received for European Patent Application Serial No. EP11822326 dated Oct. 9, 2015, 3 pages.
Office Action received for Japanese Patent Application No. 2025-142232, mailed on Jun. 24, 2026, 5 pages (3 pages of English Translation and 2 pages of Original Document).
Office Action received for Korean Patent Application No. 10-2024-7028515, mailed on Jun. 25, 2026, 13 pages (6 pages of English Translation and 7 pages 8 Original Document).
Office Action received for Taiwanese Patent Application No. 111149957, mailed on Jun. 12, 2026, 16 pages (7 pages of English Translation and 9 pages of Original Document).

* cited by examiner

CAPACITANCE AS CONTROL OF POWER APPLIED BY A BIAS-POWER-SUPPLY

BACKGROUND

Field of the Disclosure

The present disclosure relates generally to power supplies. More specifically, but without limitation, the present disclosure relates to controlling an application of power to a load.

Background

Many types of semiconductor devices are fabricated using plasma-based etching techniques. If it is a conductor that is etched, a negative voltage with respect to ground may be applied to the conductive substrate to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or time varying periodic voltage waveform may be applied by a bias supply to the conductive plate (or chuck) so that the AC field induces a voltage on the surface of the substrate. During a negative portion of the applied waveform, the surface of the substrate will be charged negatively, which causes ions to be attracted toward the negatively-charged surface during the negative portion of the periodic cycle. And when the ions impact the surface of the substrate, the impact dislodges material from the surface of the substrate—effectuating the etching.

During operation of a bias supply, the bias supply undergoes state changes, and the periodic waveform may by changed, consistent with state changes, to effectuate different ion energy distribution functions (IEDFs). For example, feature profile, and selectivity to a mask and a stop-layer may be controlled by making state changes to the bias supply to adjust the IEDF.

In some circumstances, a particular distribution of ion energies (or IEDF) may be desired, which may require accurate control of the sheath voltage ($V_{sheath}$), which generally refers to the potential difference (or voltage drop) from the plasma to the substrate surface. A bias supply may be utilized to control the voltage drop across the sheath, and some bias supplies rely upon a fundamental frequency of the voltage waveform that is applied to achieve desired sheath voltage(s). But some bias supply topologies are limited by a range of frequencies they can provide, and some instances, a satellite bias supply is frequency-synchronized to a main bias supply, so the satellite bias supply may be unable to adjust its frequency. As a consequence, new technology is needed to enable bias supplies to adjust the waveform they apply when frequency control is limited.

SUMMARY

The following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

An aspect may be characterized as a bias supply system comprising an output node, a return node, a bias supply configured to apply an asymmetric periodic voltage waveform between the output node and the return node, a variable capacitance coupled between the output node and the return node, and a controller coupled to the variable capacitance. The controller is configured to receive a setting that defines a slope of a workpiece voltage, monitor electrical parameters at the output node to obtain an indication of an actual slope of the workpiece voltage, and control the variable capacitance so the actual slope of the workpiece voltage approaches the slope defined by the setting.

Another aspect may be characterized as a method for biasing a substrate comprising coupling an output node and a return node of a bias supply to a plasma processing chamber, applying, with the bias supply, an asymmetric periodic voltage waveform across the output node and the return node to a plasma processing chamber, receiving a setting that defines a slope of a voltage at a surface of a workpiece in the plasma processing chamber, monitoring electrical parameters at the output node to obtain an indication of an actual slope of the voltage at the surface of the workpiece, and controlling a variable capacitance positioned across the output node and the return node so the actual slope of the workpiece voltage approaches the slope defined by the setting.

Another aspect disclosed herein may be characterized as a non-transient processor readable storage medium encoded with processor readable instructions, the instructions comprising instructions to apply, with a bias supply, an asymmetric periodic voltage waveform across an output node and a return node of the bias supply, receive a workpiece-voltage setting that defines a slope of a voltage at a surface of a workpiece, monitor electrical parameters at the output node to obtain an indication of an actual slope of the voltage at the surface of the workpiece, and control a variable capacitance positioned across the output node and the return node so the actual slope of the workpiece voltage approaches the slope defined by the workpiece-voltage setting.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). The instructions may be executable by a processor or may be used to program a field programmable gate array. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, "source generators" and "excitation supplies" are those whose energy is primarily directed to generating and sustaining the plasma, while "bias supplies" are those whose energy is primarily directed to generating a surface potential for attracting ions and electrons from the plasma. As used herein, the terms "workpiece," "substrate," "wafer," or "wafer substrate" may be used interchangeably throughout the disclosure.

Figure 1:
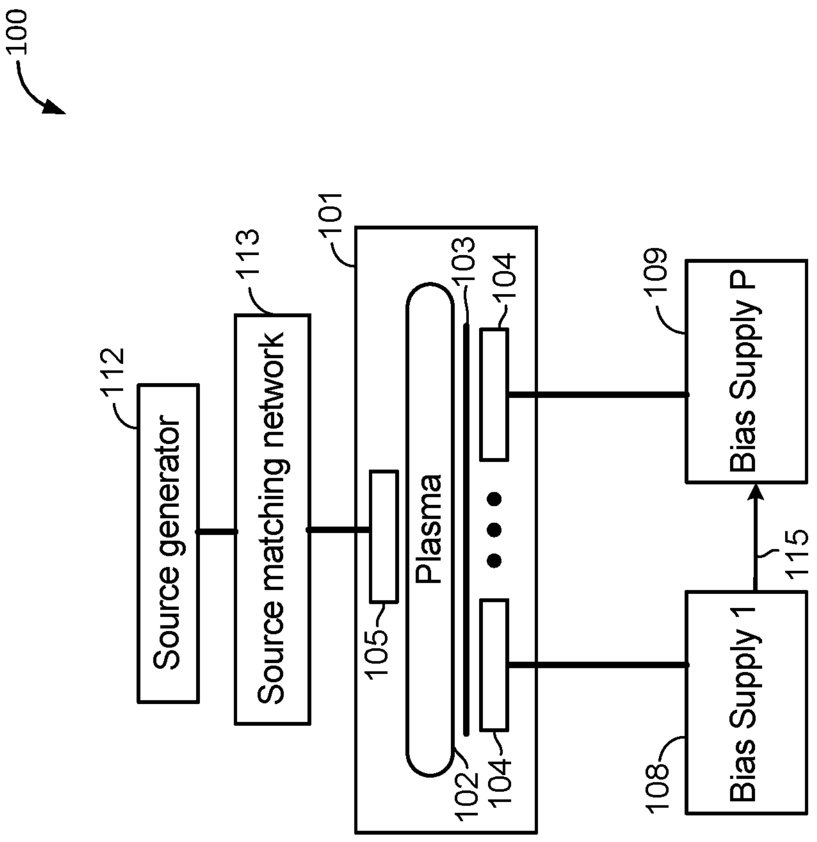
FIG. 1 is a block diagram depicting an exemplary plasma processing environment utilizing one or more bias supplies, according to various aspects of the present disclosure.

Referring first to FIG. 1, shown is an exemplary plasma processing environment 100, such as a deposition or etch system, in which one or more bias supplies may be utilized. The plasma processing environment 100 may include many pieces of equipment coupled directly and indirectly to a plasma processing chamber 101, within which a volume containing a plasma 102 and workpiece 103 (e.g., a wafer or substrate) and electrodes 104 (which may be embedded in a substrate support) are contained. The equipment may include vacuum handling and gas delivery equipment (not shown), one or more bias supplies 108, 109 one or more source generators 112, and one or more source matching networks 113. In many applications, power from a single source generator 112 is connected to one or multiple source electrodes 105. The source generator 112 may be a higher frequency RF generator (e.g., 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

In variations of the system depicted in FIG. 1, the source generator 112 and source matching network 113 may be replaced by, or augmented with, a remote plasma source. And other variations of the system may include only a single bias supply 108. It should be recognized that many other variations of the plasma processing environment depicted in FIG. 1 may be utilized. As examples without limitation, U.S. Pat. No. 10,707,055, issued Jul. 7, 2020, and U.S. Pat. No. 10,811,227, issued Oct. 20, 2020, both of which are incorporated by reference in their entirety, disclose various types of system designs.

It should also be recognized that, while the following disclosure generally refers to plasma-based workpiece processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to affect a surface change, subsurface change, deposition or removal by physical or chemical means.

Some currently used techniques often apply a time-varying radio frequency (RF) signal, such as a sinusoidal wave, as a substrate bias. This type of sinusoidal RF bias produces a time-varying substrate voltage that accelerates ions to the workpiece surface, but the sinusoidal waveform may produce a broad, uncontrolled ion energy distribution. In contrast, consistent with aspects of the present disclosure, an asymmetric periodic waveform may be utilized to apply the substrate bias, which serves to enhance the plasma etch and deposition processes as compared to the prior art. For example, an asymmetric waveform helps alleviate one or more of the issues seen in the prior art, most notably, the broad, uncontrolled ion energy distributions commonly associated with a sinewave bias. In this way, the bias supplies of the present disclosure help provide direct control of ion energy distributions by delivering a controlled, asymmetric, periodic waveform.

As shown in FIG. 1, there may be multiple bias supplies that are used to produce corresponding asymmetric waveforms. Although more than two bias supplies may be utilized, FIG. 1 depicts a main bias supply 108 and a satellite bias supply 109. The main bias supply 108 in the depicted system may establish a frequency of the asymmetric, periodic waveforms that are applied to the plasma processing chamber 101.

More specifically, the main bias supply 108 may provide a synchronization signal 115 (that defines a synchronization frequency) to the satellite bias supply 109 to enable the asymmetric periodic waveform that is applied by the satellite bias supply 109 to be synchronized with the asymmetric periodic waveform that is applied by the main bias supply 108. As is recognized by those of ordinary skill in the art, this synchronization is generally beneficial, but in some bias supply topologies, a frequency of the asymmetric periodic waveform is a control parameter that is used to achieve a desired sheath voltage (or range of sheath voltages) in order to produce a desired voltage (or range of voltages) at a surface of the workpiece 103 in order to produce a desired distribution of ion energies. But the satellite bias supply 109 is limited to applying the frequency established by the main bias supply 108, and as a consequence, the frequency of the satellite bias supply 109 may be unable to be controlled to achieve a desired sheath voltage.

Even outside of the context of the main bias supply 108 controlling a frequency of the satellite bias supply 109, a single bias supply may be limited by a range of asymmetric periodic waveform frequencies that it may apply, and as a consequence, even a single bias supply may be unable to be controlled to achieve a desired sheath voltage. For example, if the plasma processing chamber has a high chuck capacitance, it is easier to reach a bias supply's low limit of its fundamental frequency before being able to obtain to obtain a desired sheath voltage.

To address the problems associated with the frequency limitations that bias supplies may have, a variable capacitance may be added at the output of a bias supply (e.g., the bias supply 109) that can be tuned to shift the frequency range required to achieve a desired sheath voltage or range of sheath voltages. The variable capacitance may also be varied to control the sheath voltage when the bias supply is operating at a fixed fundamental frequency.

Figure 2:
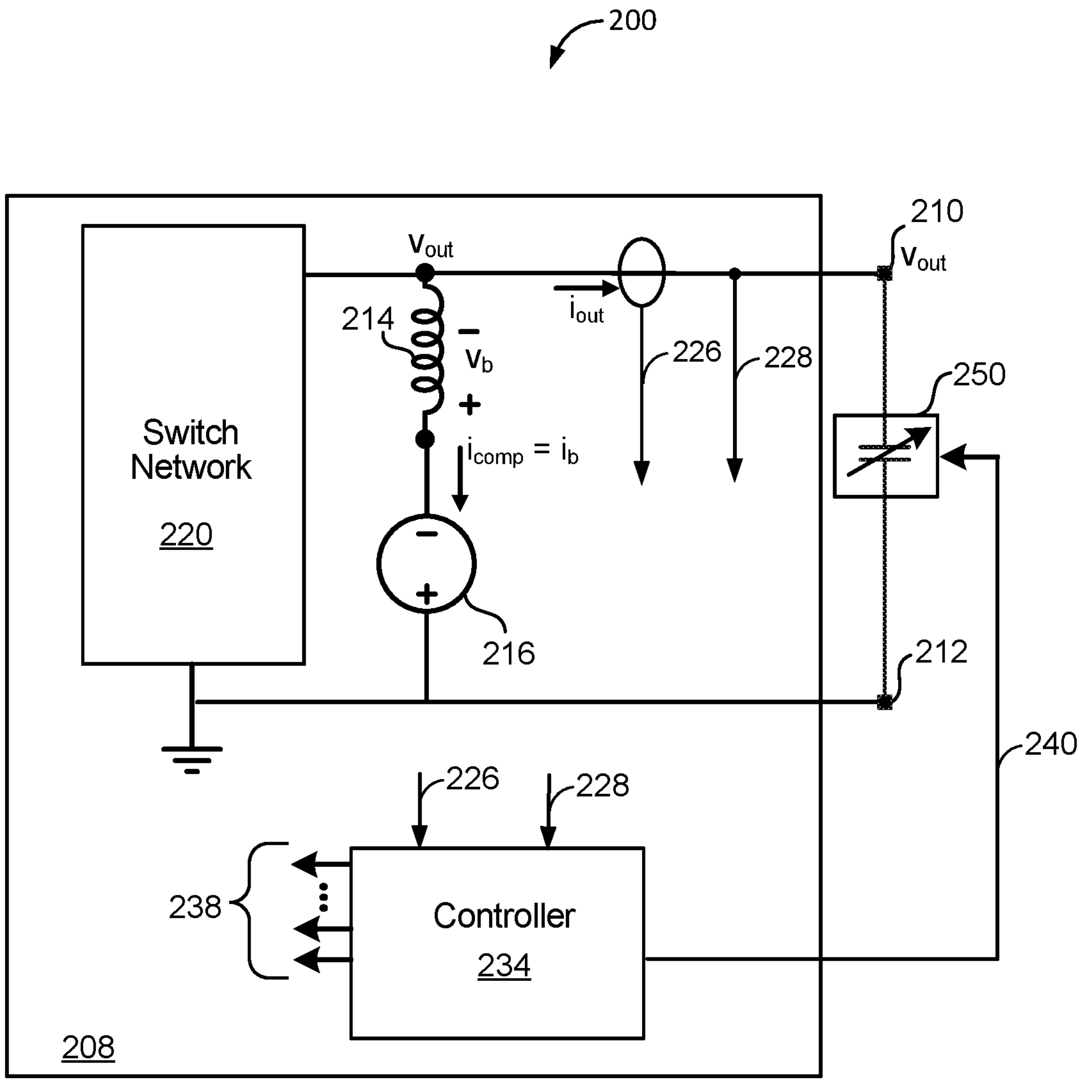
FIG. 2 is a schematic diagram depicting an example of a bias supply system.

Referring to FIG. 2 for example, shown is a bias supply system 200 that comprises a controllable capacitance 250 that is coupled between an output node 210 and a return node 212. The depicted bias supply system 200 may be implemented within a single bias supply housing, and in these implementations, the bias supply system 200 may also be characterized as a bias supply. In other implementations, the variable capacitance 250 may implemented as an external variable capacitance that is located outside of a bias supply housing 208 and the remaining components depicted in FIG. 2 may be implemented with a bias supply housing as a part of a bias supply. The components within the bias supply housing 208 make up a bias supply, and as a consequence, these components are also referred to herein as a bias supply 208.

The bias supply system 200 generally represents many variations of bias supply systems described further herein to apply a controllable asymmetric periodic voltage waveform. As shown, the bias supply system includes the output node 210 (also referred to as an output node 210), the return node 212, a switch network 220, and a series combination of an inductance 214 and a power supply 216 (also referred to herein as $V_{supply}$ 216) that is coupled between the output node 210 and the return node 212. In general, the bias supply system 200 functions to apply an asymmetric periodic voltage function between the output node 210 and the return node 212. Output current, $i_{out}$, delivered to a load through the output node 210 is returned to the bias supply 208 through the return node 212 that may be common with the load. In some cases, the load is a plasma load.

FIG. 2 also depicts examples of electrical parameters that are associated with the bias supply system 200 including an inductor voltage, $v_b$, that is a voltage across the inductance 214, which may be measured as the voltage between the output node 210 and the negative node of the power supply 216. In addition, inductance current, $i_b=i_{comp}$, that flows through the inductance 214 may be measured along the current path that includes the inductance 214 and the power supply 216. Yet another electrical parameter that may be measured is output current, $i_{out}$, which may be measured along a current path, as shown, between the switch network 220 and the output node 210. In addition, the output voltage, $v_{out}$, is another electrical parameter that may be measured and utilized as described herein. For example, $v_{out}$ may be the voltage (or potential difference) between the output node 210 and the return node 212. As described herein, the return node 212 may be grounded in some variations of the bias supply 208 or may be another non-zero voltage. It should be recognized that other electrical parameters of the bias supply system 200 may be monitored and/or measured depending upon the particular design of the bias supply system 200.

As shown, the bias supply system 200 may include a controller 234 that functions to control the power supply 216, the switch network 220, and/or the variable capacitance 250 based upon one or more of the electrical parameters (e.g., $i_b$, $v_b$, $i_{out}$, and $v_{out}$). The controller 234 may reside within the bias supply housing 208, or alternatively, may reside external to the bias supply housing 208. When implemented external to the bias supply housing, the controller 234 may be implemented as a portion of a centralized controller that controls several pieces of processing equipment such as, for example and without limitation, the bias supply 108, 109 the source generator (e.g., shown as source generator 112 in FIG. 1), the source matching network 113, the switch network 220, mass flow controllers, and other applicable components. The controller 234 may also be distributed between a bias supply and control-related components that are external to the bias supply. It is also contemplated that the controller 234 may be implemented within a housing of another piece of equipment such as the source generator, such as source generator 112 in FIG. 1, or the controller 234 may be implemented as a distributed controller that resides in several pieces of equipment.

As shown, the controller 234 may monitor power parameters by receiving one or more signals including a current signal 226 indicative of the output current, $i_{out}$, and voltage signals 228 indicative of the output voltage, $v_{out}$. Although not shown in FIG. 2 for purposes of simplicity, those of ordinary skill in the art will readily appreciate that the output current, $i_{out}$ and output voltage, $v_{out}$ may be sensed by current and voltage sensors readily known in the art to produce the current signal 226 and the voltage signal 228, which may be sampled and converted to produce digital representations of the signals 226, 228, respectively.

As discussed further herein, the controller 234 receives the measurements and is generally configured to control (by providing control signals) the switch network 220 and the power supply 216 to effectuate desired aspects of the asymmetric periodic voltage waveform (as described further herein) that is applied to the output node 210 and the return node 212. But in addition, the controller 234 is configured to control the variable capacitance 250 as described further herein.

Figure 3:
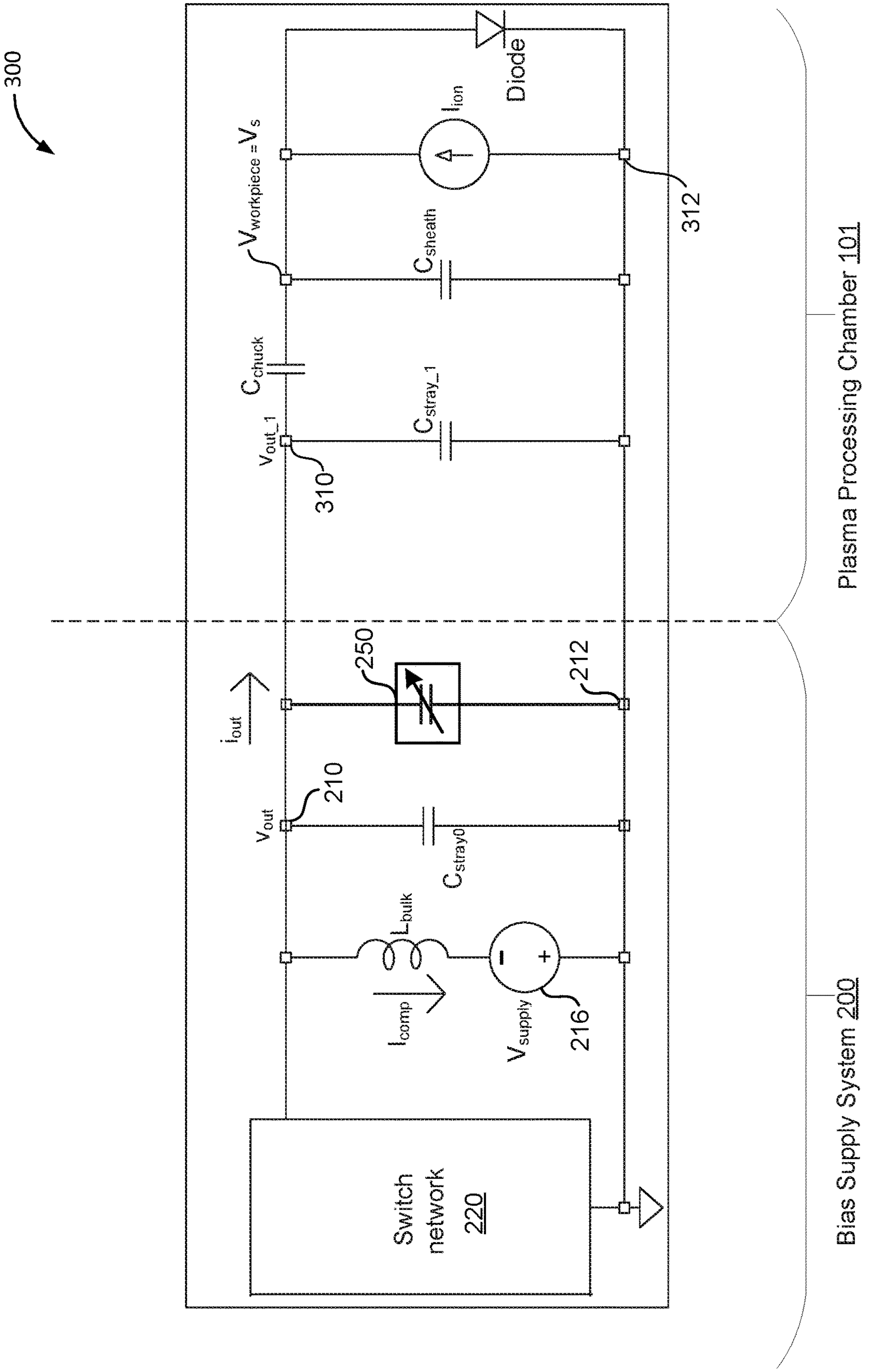
FIG. 3 is a schematic diagram electrically representing aspects of a bias supply system and plasma processing chamber.

Turning now to FIG. 3, which illustrates a schematic drawing 300 that electrically depicts lumped components (e.g., lumped inductive and capacitive components) of the bias supply system 200 and the plasma processing chamber 101. As shown, the plasma processing chamber 101 may be represented by a chuck capacitance, $C_{chuck}$, (that includes a capacitance of a chuck and workpiece, such as workpiece 103 shown in FIG. 1) that is positioned between an input 310 (also referred to as an input node 310) to the plasma processing chamber 101 and a node representing a sheath voltage, $V_s$, at a surface of the workpiece 103. As a consequence, references to the sheath voltage, $V_s$, are also referred to as a voltage at a surface of the workpiece (shown as $V_w$ in FIG. 3). In addition, a return node 312 (which may be a connection to ground) is depicted. The plasma (shown as plasma 102 in FIG. 1) in the processing chamber 101 is represented by a parallel combination of a sheath capacitance, $C_{Sheath}$, a diode, and a current source, $I_{ion}$. The diode represents the non-linear, diode-like nature of the plasma sheath that results in rectification of the applied AC field, such that a direct-current (DC) voltage drop, appears between the workpiece 103 and the plasma 102.

As seen, FIG. 3 also depicts lumped-element capacitances $C_{stray\_0}$ and $C_{stray\_1}$. In this example, $C_{stray\_0}$ is a lumped-element capacitance representing stray capacitance from an output node 210 of the bias supply 208 to the return node 312, while $C_{stray\_1}$ is a lumped-element capacitance representing the capacitance from an input node 310 of the processing chamber 101 to the return node 312. In some cases, one or more of the $C_{stray\_0}$ and $C_{stray\_1}$ lumped-element capacitances may include a capacitance of a connector and filter capacitance. Also shown is the variable capacitance 250, which is positioned to be in parallel with the stray capacitance, $C_{stray\_0}$. The variable capacitance 250 is additive with Cstray0 and Cstray1, so a total stray capacitance, Cstray, is equal to Cstray0+Cstray1+the capacitance of the variable capacitance 250.

Figure 4:
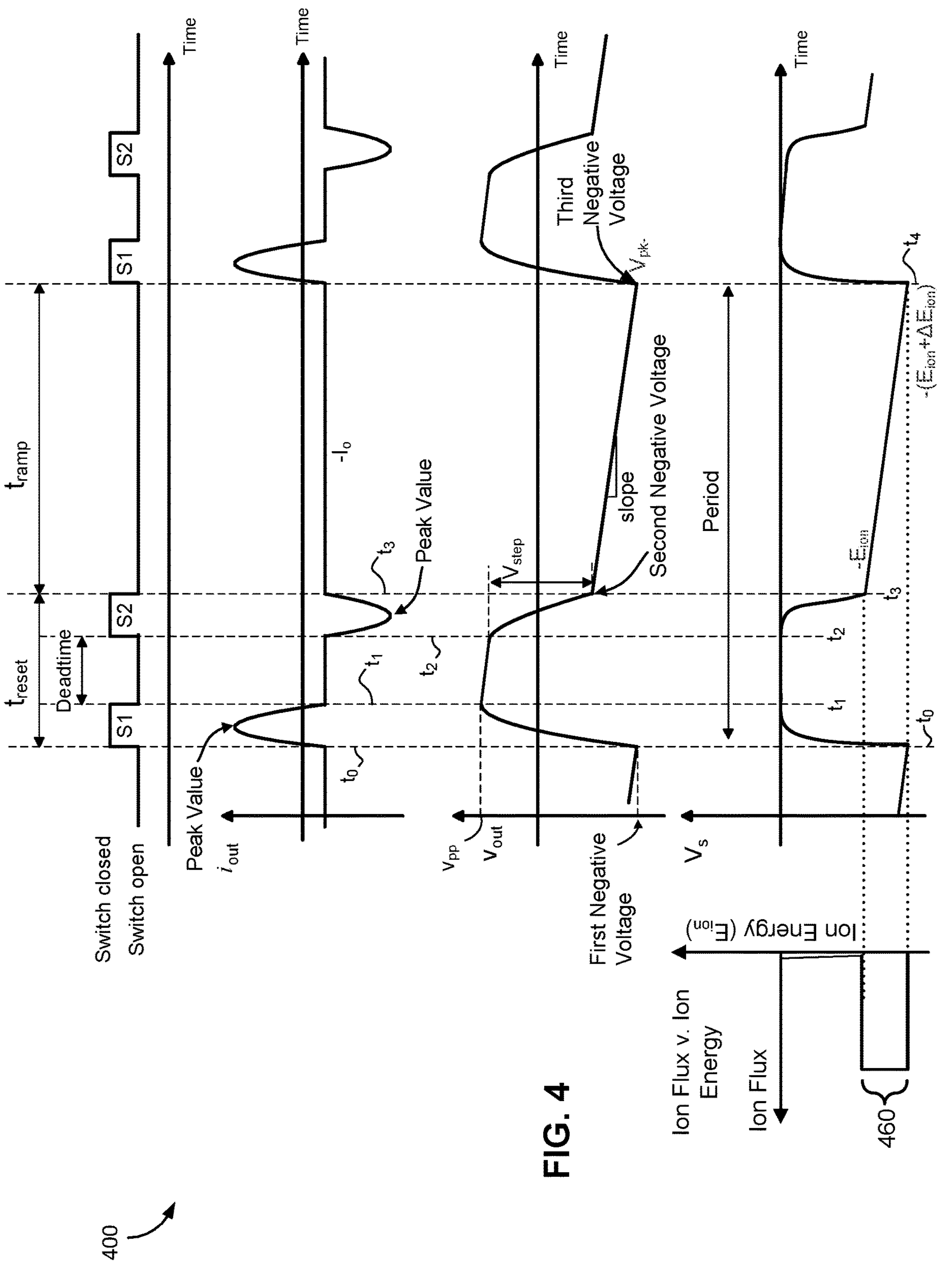
FIG. 4 depicts conceptual graphs of voltage and current waveforms generated by a bias supply system.
Figure 5:
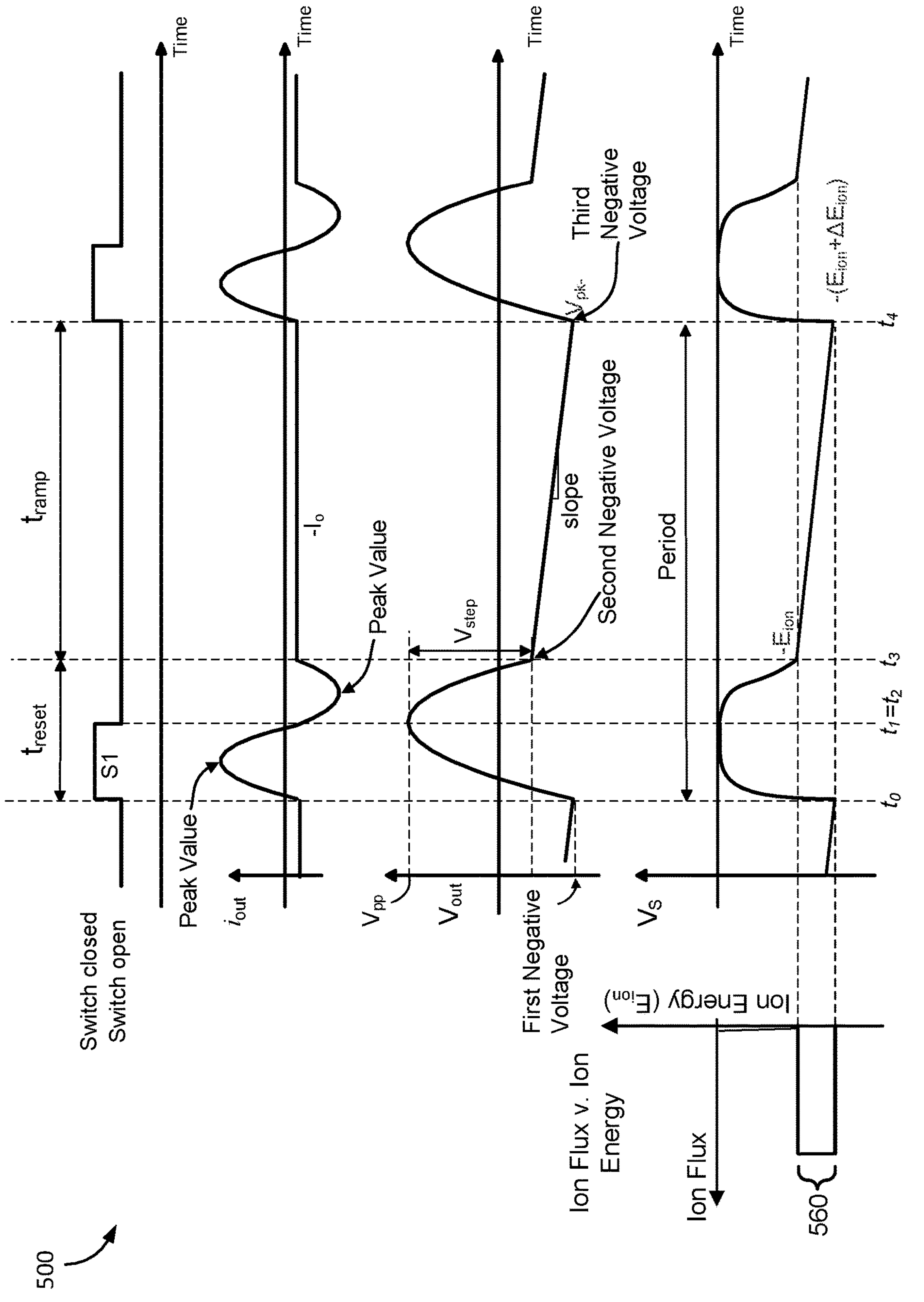
FIG. 5 depicts conceptual graphs of voltage and current waveforms generated by another bias supply system.

Referring next to FIGS. 4 and 5, shown are timing diagrams 400 and 500, respectively, associated with implementations of the switch network 220 that have two switches and one switch, respectively. Each of FIGS. 4 and 5 show a period of an asymmetric periodic voltage waveform ($v_{out}$) from a time $t_0$ to $t_4$ and a corresponding current waveform ($i_{out}$). As depicted in FIG. 4, the bias supplies 208 disclosed herein operate to apply an asymmetric periodic voltage waveform, $V_{out}$, between the output node 210 and the return node 212 of the bias supply 208 during a period of the asymmetric periodic voltage waveform from time $t_0$ to $t_4$. As shown, the asymmetric periodic voltage waveform, $v_{out}$, comprises a first section, from $t_0$ to $t_3$, that begins with a first negative voltage and changes to a second, peak voltage, Vpp, before changing to a second negative voltage at $t_3$. The asymmetric periodic voltage waveform, $v_{out}$, also comprises a second section, from $t_3$ to $t_4$, that begins with the second negative voltage and comprises a voltage ramp between the second negative voltage and a third negative voltage level.

The asymmetric periodic voltage waveform, $v_{out}$, may also me characterized in terms of voltage portions. As shown, the asymmetric periodic voltage waveform, $v_{out}$, comprises a first portion (from time $t_0$ to $t_1$) that begins with the first negative voltage and changes to a second, positive peak voltage, Vpp, (at time $t_1$) at or near the end of the first portion. The asymmetric periodic voltage waveform, $v_{out}$, also changes from the second, peak positive voltage level to a third positive voltage level at time $t_2$ during the second portion (from time $t_1$ to $t_2$), where the third positive voltage level is slightly below the peak voltage level, Vpp. At or near the end of the second portion, the asymmetric periodic voltage waveform, $v_{out}$, drops by a step voltage ($V_{step}$) such that it is at the second negative voltage (at time $t_3$). That is, during the third portion (from time $t_2$ to $t_3$) the asymmetric periodic voltage waveform drops by the step voltage, $V_{step}$, to the second negative voltage at $t_3$. In some cases, the asymmetric periodic voltage waveform also comprises a fourth portion (from time $t_3$ to $t_4$), where the fourth portion includes a negative voltage ramp between the second negative voltage level at $t_3$ and the third negative voltage level (also referred to as Vpk−) at $t_4$. As seen, at time $t_4$, the asymmetric periodic voltage waveform, $V_{out}$, is at the peak negative voltage, $V_{pk-}$, where the peak negative voltage may have the same or similar magnitude as the first negative voltage at the start of the cycle (i.e., at $t_0$).

As shown in FIGS. 4 and 5, the asymmetric periodic voltage waveform, $v_{out}$, comprises a voltage step, $V_{step}$, between times $t_2$ and $t_3$, where the voltage step or $V_{step}$ corresponds to a sheath voltage at $t_3$ that produces ions at an energy level, $-E_{ion}$. Because an energy level of ions is a function of $V_{step}$, $V_{step}$ is a parameter that is used as a setpoint in some embodiments of the bias supply system 200.

In some circumstances, during the fourth portion ($t_3$ to $t_4$) of the asymmetric periodic voltage waveform, the sheath voltage may become more negative so that at $t_4$, ions at an energy level of $-(E_{ion}+\Delta E_{ion})$ are produced. As shown, a magnitude of $\Delta E_{ion}$ corresponds to a distribution of ion energies 460, 560 where a larger magnitude of $\Delta E_{ion}$ indicates there will be a larger distribution 460, 560 of ion energies and a smaller magnitude of $\Delta E_{ion}$ indicates there will be a smaller distribution 460, 560 of ion energies. As a consequence, $\Delta E_{ion}$ is another setpoint used in embodiments of the bias supply system 200, and as discussed further herein, a frequency of the asymmetric periodic voltage waveform and/or a capacitance of the variable capacitance 250 may be used to control $\Delta E_{ion}$. The ΔEion setpoint may be referred to as workpiece-voltage setting because it defines a voltage difference between −Eion (shown at t3) and −(Eion+ΔEion) shown at t4, and as shown in FIGS. 4 and 5, the workpiece-voltage setting defines a slope of a workpiece voltage (between time t3 and t4).

Also shown in FIGS. 4 and 5 are times $t_{reset}$ (between times $t_0$ and $t_3$) and $t_{ramp}$ (between times $t_3$ and $t_4$). As shown, $t_{reset}$ covers a time that includes the first, second, and third portions ($t_0$ to $t_3$) of the asymmetric periodic voltage waveform, while $t_{ramp}$ includes the fourth portion ($t_3$ to $t_4$). In many modes of operation, controlling $t_{ramp}$ is an effective approach to controlling the period, and hence frequency, of the asymmetric periodic voltage waveform.

FIGS. 4 and 5 also depict the peak negative voltage, $V_{pk-}$, which identifies an end to the fourth portion of the asymmetric periodic voltage function. As further described herein, the negative voltage peak, $V_{pk-}$, may be used as a control parameter. For example, a threshold value for the negative voltage peak, $V_{pk-}$, may trigger the closing of switch S1 and opening of switch S2 (as shown in FIG. 4) or closing the single switch S1 that is controlled with reference to FIG. 5.

As shown in FIGS. 4 and 5, a full current cycle occurs between times $t_0$ and $t_3$ of the asymmetric periodic voltage waveform. Additionally, $t_{ramp}$ between $t_3$ and $t_4$ corresponds to the time between two adjacent full current cycles. An aspect of the present disclosure addresses the problem of how to adjust the output current, $i_{out}$, to compensate for the ion current, $I_{ion}$ (shown by way of the $I_{ion}$ current source in FIG. 3). Another aspect of the present disclosure addresses the problem of how to adjust a level of ion energies, $E_{ion}$, and distribution of the ion energies (IEDF) in the plasma processing chamber 101.

As shown in FIG. 4, in variations of the bias supplies 208 that comprise two switches, the second portion of the asymmetric periodic voltage waveform may transition (during the time between time $t_1$ to $t_2$) to the third portion of the asymmetric periodic voltage waveform. And as shown in FIG. 5, in variations of the bias supplies 208 that comprise one switch, $t_1$ may equal $t_2$ and the first portion of the asymmetric periodic voltage waveform may end (and the second portion may start) at a positive peak voltage level (Vpp). Further details of both single-switch and two-switch bias supplies are disclosed further herein in relation to FIGS. 11A and 11B, but FIGS. 4 and 5 provide a reference for the various control methodologies and the various structural variations disclosed further herein.

Shown in FIG. 4 are a switching sequence of a first switch, S1, and a second switch, S2; output current, $i_{out}$, provided at the output node 210; output voltage, $v_{out}$, at the output node 210; and the sheath or workpiece voltage, $V_s$~Vw (also shown in FIG. 3); and a corresponding ion energy distribution function (IEDF) depicted as ion flux versus ion energy.

As shown in FIG. 4. the first switch, S1, and the second switch, S2, may be controlled so that output current, $i_{out}$, completes a full current cycle between times $t_0$ and $t_3$. During a start of a current cycle at to, the output current, $i_{out}$, is controlled from a level $-I_o$, to reach a positive peak current value, and then the current is controlled to fall back to $-I_o$, at $t_1$. Then, at $t_2$, the output current, $i_{out}$, is controlled from the level $-I_o$, to increase, to a peak value in an opposite direction (i.e., opposite from the positive peak current value or decrease to a negative peak current value) before decreasing back to $-I_o$ at $t_3$. More specifically, during the positive portion of the current cycle (when the first switch, S1, is closed and the second switch, S2, is open), the current increases to a peak positive value then decreases to $-I_o$. Additionally, during a negative portion (from time $t_2$ to $t_3$) of the full current cycle, the current increases to a negative value peak value then decreases to $-1_o$.

As shown, in FIG. 4, the first switch, S1, and the second switch, S2, may be controlled with an adjustable deadtime, which is the time from $t_1$ to $t_2$ (after the switch, S1, is opened from a closed position and before S2 is closed). As depicted in FIG. 4, controlling the deadtime enables $t_{reset}$ to be controlled. Furthermore, adjusting a ratio of $t_{reset}$ to $t_{ramp}$ helps adjust the average power supplied by the bias supply system 200 to the plasma processing chamber. In some cases, control over $t_{reset}$ also enables the fundamental switching frequency to be controlled (e.g., to remain below a level that affects plasma density in the plasma processing chamber 101).

Another aspect of control that may be achieved with the bias supply system 200 disclosed herein is ion current compensation, $i_{comp}$. More specifically, the length of the deadtime, the length of $t_{ramp}$, and/or the period of the periodic voltage function (between $t_0$ and $t_4$) may be controlled to control a level of ion current compensation. In FIG. 4, $t_{ramp}$, the deadtime, and/or the level, $I_o$, may be controlled (if desired) so that ion current, $I_{ion}$, is compensated to a point where:

$$I_o = I_{ion} - (C_{chuck} + C_{stray\_1})*\text{slope, and}$$

$I_{comp} = I_{ion} - (C_{chuck} + C_{stray\_0} + C_{stray\_1})$*slope, where "slope" in this context corresponds to the slope of the output voltage, $V_{out}$, from $t_3$ to $t_4$. As discussed further herein, the addition of the variable capacitance 250 adds to the stray capacitance $C_{stray\_total}$=Cstray0+Cstray1+the capacitance of the variable capacitance 250 so that $I_{comp} = I_{ion} - (C_{chuck} + C_{stray\_total})$*slope.

As shown in FIG. 4, when overcompensating for ion current, the sheath voltage $V_s$ (and the voltage at the surface of the workpiece 103 in FIG. 1) becomes increasingly negative between times $t_3$ and $t_4$ (i.e., during the $t_{ramp}$ time frame). In some cases, there is a distribution of ion energies as a result of the range of sheath voltages between $t_3$ and $t_4$. It should be recognized, however, that ion current may be undercompensated so that the sheath voltage $V_s$ (and the voltage at the surface of the workpiece 103) becomes less negative between times $t_3$ and $t_4$ (during the $t_{ramp}$ time frame). That is, under compensation of the ion current can result in a less negative slope in $V_{out}$ and/or a positive slope in the sheath voltage, $V_s$, during the $t_{ramp}$ time frame.

It is also possible to adjust the slope of the bias output voltage, $v_{out}$, between $t_3$ and $t_4$ so that the workpiece voltage, $V_w$, and sheath voltage, $V_s$, is substantially constant between $t_3$ and $t_4$, which results in a very narrow distribution of ion energy (or narrow IEDF). To achieve a flat workpiece voltage (where ΔEion=0), Icomp=$(1+C_{stray\_total}/C_{chuck}) * I_{ion}$.

By adjusting both deadtime and $t_{ramp}$, the frequency of the asymmetric, periodic voltage waveform may be fixed if desired, but it is also possible to vary the deadtime, $t_{ramp}$, to affect the frequency of the asymmetric, periodic voltage waveform, $v_{out}$. It is also contemplated that the deadtime may be shortened while shortening or lengthening $t_{ramp}$, in some embodiments. As discussed, in some instances there are limits to the changes that can be made to the frequency of the asymmetric, periodic voltage waveform, and adjustments to the variable capacitance 250 enable adjustments to $\Delta E_{ion}$ when there are frequency limitations.

In a single-switch network, as shown in FIG. 5, the switch network (e.g., switch network 220 in FIG. 2) may be controlled so that the output current, $i_{out}$, completes a full cycle from a level $-I_o$ to a peak positive value, back to the level $-I_o$, to a peak value in an opposite direction (i.e., to a peak negative value) and back to the level $-I_o$. It should be recognized that the peak value of the current (e.g., peak positive value between $t_0$ and $t_1=t_2$) in a first half of the current cycle may be different than the peak value of the current (e.g., negative peak value between $t_1=t_2$ and $t_3$) in the second half of the current cycle.

Figure 6:
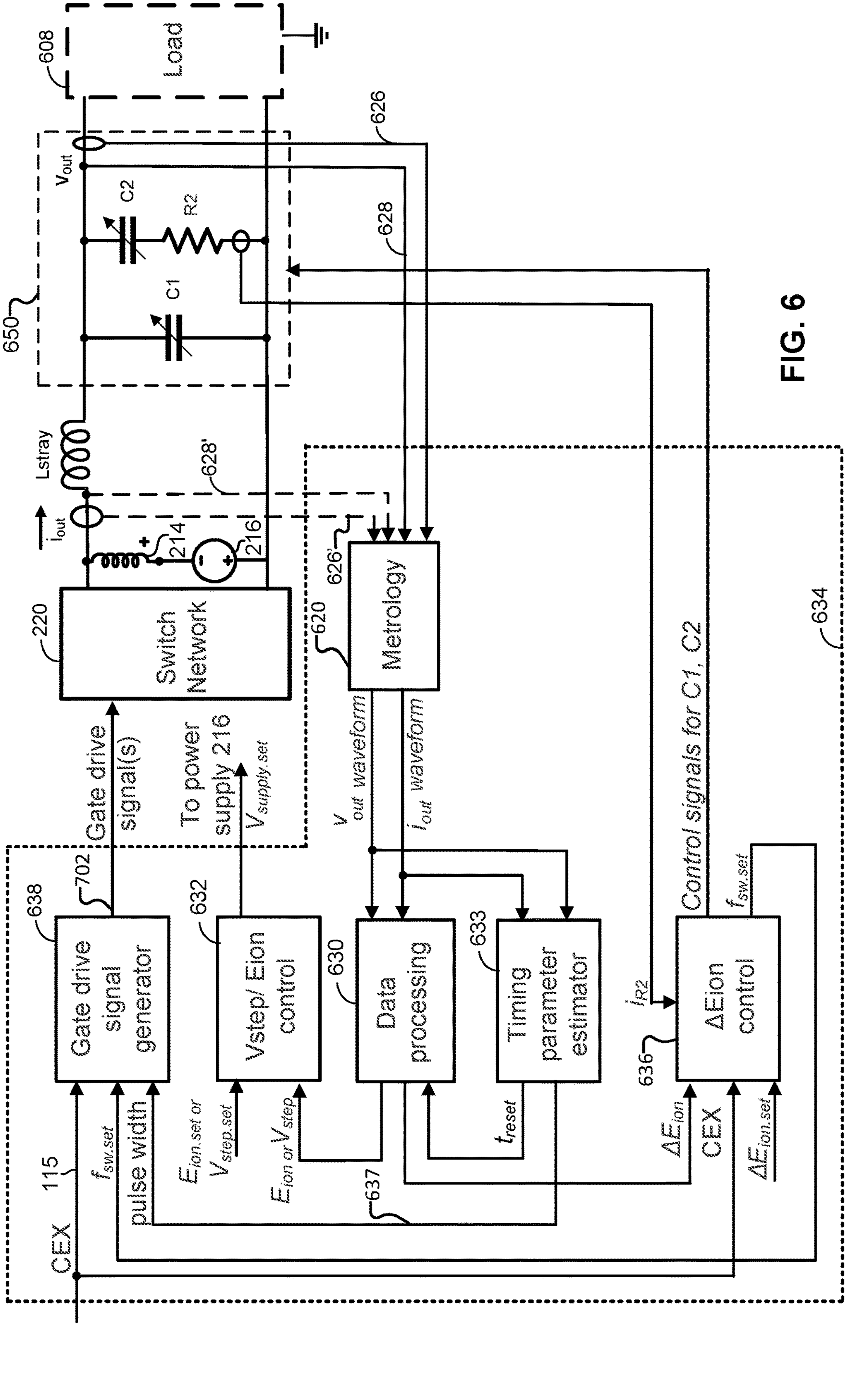
FIG. 6 is a block diagram depicting a control architecture according to various aspects of the disclosure.

Referring next to FIG. 6, shown is a block diagram depicting general aspects of metrology, readback, and control, according to various aspects of the disclosure. More specifically, FIG. 6 depicts a controller 634 (which is an example of the controller 234), a switch network 220, variable capacitance 650, and a load 608. As shown, controller 634 includes a metrology component 620, a data processing component 630, a Vstep/Eion controller 632, a timing parameter estimator 633, a ΔEion controller 636, and a gate drive signal generator 638. The depicted variable capacitance 650 is an example of variable capacitance 250 that includes a first adjustable capacitor, C1, coupled between the output node and the return node, and a series combination of a second capacitor, C2, and a dissipation resistor, R2, coupled between the output node and the return node.

The second variable capacitor, C2, is an optional filtering capacitance that filters ringing that may occur due to the addition of the first variable capacitor, C1. The current associated with the filtered ringing is dissipated by the dissipation resistor, R2. As discussed further herein, the second variable capacitor, C2, may be adjusted to filter ringing while limiting heat that is dissipated by the dissipation resistor, R2.

In general, the metrology component 620 receives and samples signals indicative of electrical parameter values and provides a digital representation of the electrical parameter values to the data processing component 630. For example, the electrical parameters may include output current, $i_{out}$ and output voltage, $v_{out}$. It is also contemplated that other electrical parameters such as $i_{comp}$ and $v_b$ may also be monitored.

A current-signal line 626 may provide analog signals from a current transducer that are indicative of output current, $i_{out}$, provided at the output of the bias supply system 200, and a voltage line 628 may provide analog signals that are indicative of the output voltage, $v_{out}$, at the output of the bias supply system 200. In response to receiving the signals (indicative of $i_{out}$ and $v_{out}$), the metrology component 620 samples and digitizes the signals. For example, the metrology component 620 may provide complete digital representations of $v_{out}$ and the output current, $i_{out}$. As shown, current-signal line 626' may optionally provide analog signals from a current transducer that are indicative of output current, $i_{out}$, provided to the output node 210, and a voltage line 628' may provide analog signals that are indicative of the output voltage, $v_{out}$, across the output node 210 and the return node.

Although not required, the metrology component 620 may be realized in part by a field programmable gate array (FPGA), and the data processing component 630, a Vstep/Eion controller 632, timing parameter estimator 633, ΔEion controller 636, and gate drive signal generator 638 may be realized by one or more processors that execute code (e.g., processor-executable code) stored in non-transitory media. But other combinations of hardware, software, and firmware may be used in different embodiments.

As shown, the digital representations of the asymmetrical periodic voltage waveform, $v_{out}$; the output current, $i_{out}$ and/or $i_{comp}$ may be provided to the data processing component 630, which may further process the digital representations of the asymmetrical periodic voltage waveform, $v_{out}$; the output current, $i_{out}$ and/or $i_{comp}$ to provide feedback values for of one or more of sheath voltage, $V_s$, (which represents workpiece voltage) and one or more other parameter values such as $E_{ion}$, $V_{step}$, and $\Delta E_{ion}$.

For example, the data processing component 630 may calculate $E_{ion}$ as:

$$E_{ion} = \frac{C_{chuck}}{C_{chuck}+C_{sheath}}V_{step} - \frac{1}{C_{chuck}+C_{sheath}}\int_{t_2}^{t_3} i_{ion}\,dt \approx \frac{C_{chuck}}{C_{chuck}+C_{sheath}}V_{step}$$

Where Vstep may be measured at Vout.

And the data processing component 630 may determine $\Delta E_{ion}$ as a difference in the workpiece voltage, $V_w$, from time $t_3$ to time $t_4$ where a reconstructed workpiece voltage, $V_w$ may be determined as:

$$V_w(t) = V_w(t_0) + \frac{C_{ch}+C_{stray}}{C_{ch}}[v_{out1}(t) - v_{out1}(t_0)] - \frac{1}{C_{ch}}\int_{t_0}^{t} i_{out}\,dt$$

Where Cstray=a capacitance of the variable capacitance 250+Cstray1, where Cstray1 is a lumped-element capacitance representing capacitance from an output of the bias supply 208 to an input 310 of the chamber 101 (including a capacitance of a connector and filter capacitance).

The relationship between $\Delta E_{ion}$ and the capacitance of the variable capacitance 250 may also be seen as follows:

$$\Delta E_{ion} = E_{ion} * \frac{\sqrt{1+4F(1-F)(1/K_c-1)} - (1+2F)}{2}$$

Where $$K_c = \frac{C_{stray} + \frac{C_{chuck}C_{sheath}}{C_{chuck}+C_{sheath}}}{C_{stray}+C_{chuck}}$$

and Cstray=Cstray0+Cstray1+the capacitance of the variable capacitance 250. And $$F = \frac{I_{ion}t_{ramp}}{(C_{chuck}+C_{sheath})E_{ion}}.$$

As shown, the Vstep/Eion controller 632 is configured to receive a Vstep setpoint or a Eion setpoint from an operator of the bias supply system 200 and provide a power supply signal, Vsupply.set, to the power supply to set the voltage of the power supply 216. The setting may be either a Vstep setpoint or a Eion setpoint because Vstep and Eion are related $$\left(E_{ion} \approx \frac{C_{chuck}}{C_{chuck}+C_{sheath}}V_{step}\right),$$

so one of ordinary skill in the art will appreciate that the bias supply system 200 may use either Vstep or Eion to set a desired ion energy level. Because the Vstep/Eion controller 632 controls ion energy, the Vstep/Eion controller 632 is also referred to as an ion energy controller 632. If the ion energy controller 632 is designed to receive a Vstep value as a setpoint, then the data processing component provides a measured Vstep value to the ion energy controller 632. And if the ion energy controller 632 is designed to receive an Eion value as a setpoint, then the data processing component provides a measured Eion value to the ion energy controller 632. In response, the ion energy controller 632 provides the power supply signal, Vsupply.set, to the power supply to set the voltage of the power supply 216.

The timing parameter estimator 633 may receive the digital representations of the output waveform, vout, and the output current, iout, and produce a pulse-width control signal. In some examples, the timing parameter estimator 633 detects when there is zero current flowing through switches of the bias supply 208 to reduce switching-related losses. The timing parameter estimator 633 may also determine treset (shown in FIGS. 4 and 5), where the value for treset may be provided to the data processing compoent 630.

The gate drive signal generator 638 is configured to provide gate drive signals to the switches (e.g., switches S1 and/or S2 in FIGS. 11A and 11B) of the bias supply 208 responsive to the pulse-width control signal 637 from the timing parameter estimator 633, a frequency setpoint signal, $F_{sw\_set}$, and/or a synchronization signal 115 to control a frequency of the switching of the bias supply 208. Although many types of switches are controlled by electrical gate drive signals, it is also contemplated that optical control signals may be used. In one non-limiting example, the gate drive signal generator 638 is configured to provide the optical control signals. As shown, the gate drive signal generator 638 may also receive a synchronization signal 115 (also referred to as a common exciter signal (CEX)), which the gate drive signal generator 638 may use to produce gate drive signals that result is an asymmetric periodic voltage waveform that has a frequency that is indicated by the synchronization signal 115.

As shown, the ΔEion controller 636 is configured to receive a setpoint signal, ΔEion.set, that defines values for multiple related parameters. For example, the setpoint signal, ΔEion.set, defines a slope of the negative voltage ramp (shown between $t_3$ and $t_4$ in FIGS. 4 and 5), which defines the slope of the workpiece voltage (shown as sheath voltage, Vs, between $t_3$ and $t_4$ in FIGS. 4 and 5), which defines the distribution of ion energies 460, 560. Thus, the setpoint signal, ΔEion.set, may be referred to as a voltage setting, a negative voltage ramp setting, a workpiece-voltage setting, and an ion energy distribution setting.

As shown, the ΔEion controller 636 also receives a measured parameter value, ΔEion, corresponding to the setpoint parameter, ΔEion.set. So, if the setpoint signal, ΔEion.set, is a negative voltage ramp setting, then the measured parameter value for ΔEion may be a measured value of the negative voltage ramp (the negative voltage ramp of $v_{out}$ between times $t_3$ and $t_4$ in FIGS. 4 and 5). As another example, if the setpoint signal, ΔEion.set, is a workpiece-voltage setting, then the measured parameter value for ΔEion may be a value of an actual slope of the workpiece voltage (shown as the slope of Vs between times $t_3$ and $t_4$ in FIGS. 4 and 5).

The ΔEion controller 636 may also receive the synchronization signal 115 and a current-signal, $i_{R2}$, that is indicative of current through the dissipation resistor, R2. As shown, the ΔEion controller 636 may provide the frequency setpoint signal Fsw_set to the gate drive signal generator 638 to control a frequency of the switching of the bias supply 208. In addition, the ΔEion controller 636 also provides one or more control signals to the variable capacitance 250. In the example depicted in FIG. 6, ΔEion controller 636 provides a first control signal to control the first variable capacitor, C1, and the ΔEion controller 636 provides a second control signal to control the second variable capacitor, C2.

Figure 13:
FIG. 13 is a graph depicting operational aspects of the present disclosure.

Referring briefly to FIG. 13, shown are graphs depicting a switching frequency, fsw, that is required to reach a flat workpiece voltage for three different asymmetrical periodic voltage waveforms where a first waveform 1302 is characterized by a Vstep value of 500 Volts, a second waveform 1304 is characterized by a Vstep value of 750 Volts, and a third waveform 1306 is characterized by a Vstep value of 1000 Volts. As discussed above, the switching frequency, fsw, corresponds to the frequency of the asymmetric periodic voltage waveform, and a flat workpiece voltage will produce a relatively narrow distribution of ion energies.

As shown, for any of the three waveforms, when a capacitance of the variable capacitance 250 is increased, the switching frequency, fsw, that achieves a flat workpiece voltage increases. For example, the waveform 1306 with a Vstep of 1000 Volts will achieve a flat workpiece voltage (from times t3 to t4 in FIGS. 4 and 5) at a frequency of 200 kHz when the value of the variable capacitance 250 is zero farads. But when the value of the variable capacitance 250 is increased to 1000 pF, the switching frequency, fsw, that will achieve a flat workpiece voltage is over 300 kHz. This shift to higher frequencies (that achieve a flat workpiece voltage) may be beneficial where the bias supply 208 has limitations in a range of frequencies. For example, if the bias supply 208 can only effectively operate above 300 kHz with a Vstep of 1000 Volts, then increasing the value of the variable capacitance 250 to be at least 1000 pF enables the bias supply 208 to achieve a flat workpiece voltage.

FIG. 13 also depicts the benefit of the variable capacitance 250 when a frequency of the bias supply is fixed. For example, if the operating frequency of the bias supply 208 is fixed at 350 kHz (e.g., because the bias supply 208 receives a synchronization signal 115 fixing its frequency at 350 kHz), then adjusting the variable capacitance 250 to be 1000 pF will enable the bias supply 208 to achieve a flat workpiece voltage with a Vstep of 750 Volts.

Figure 7:
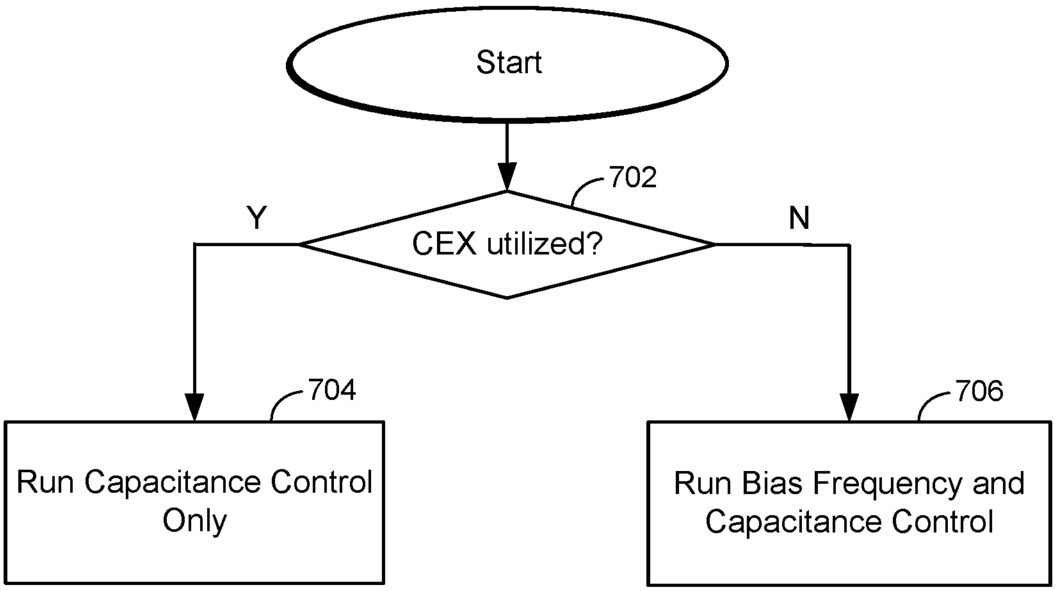
FIG. 7 is a flowchart depicting control aspects of the disclosure.

Referring next to FIG. 7, shown is a general flowchart depicting a method for controlling the bias supply system 200, at least in part, utilizing the variable capacitance 250. As shown, if the synchronization signal 115 (also referred to as a common exciter signal (CEX)) is utilized to control a frequency of the bias supply system 200 (Block 702), then the bias supply system 200 controls $\Delta E_{ion}$ by running a capacitance control method (Block 704). But if CEX is not utilized, the bias supply system 200 may control $\Delta E_{ion}$ utilizing both frequency control and capacitance control methodologies (Block 706).

Figure 8:
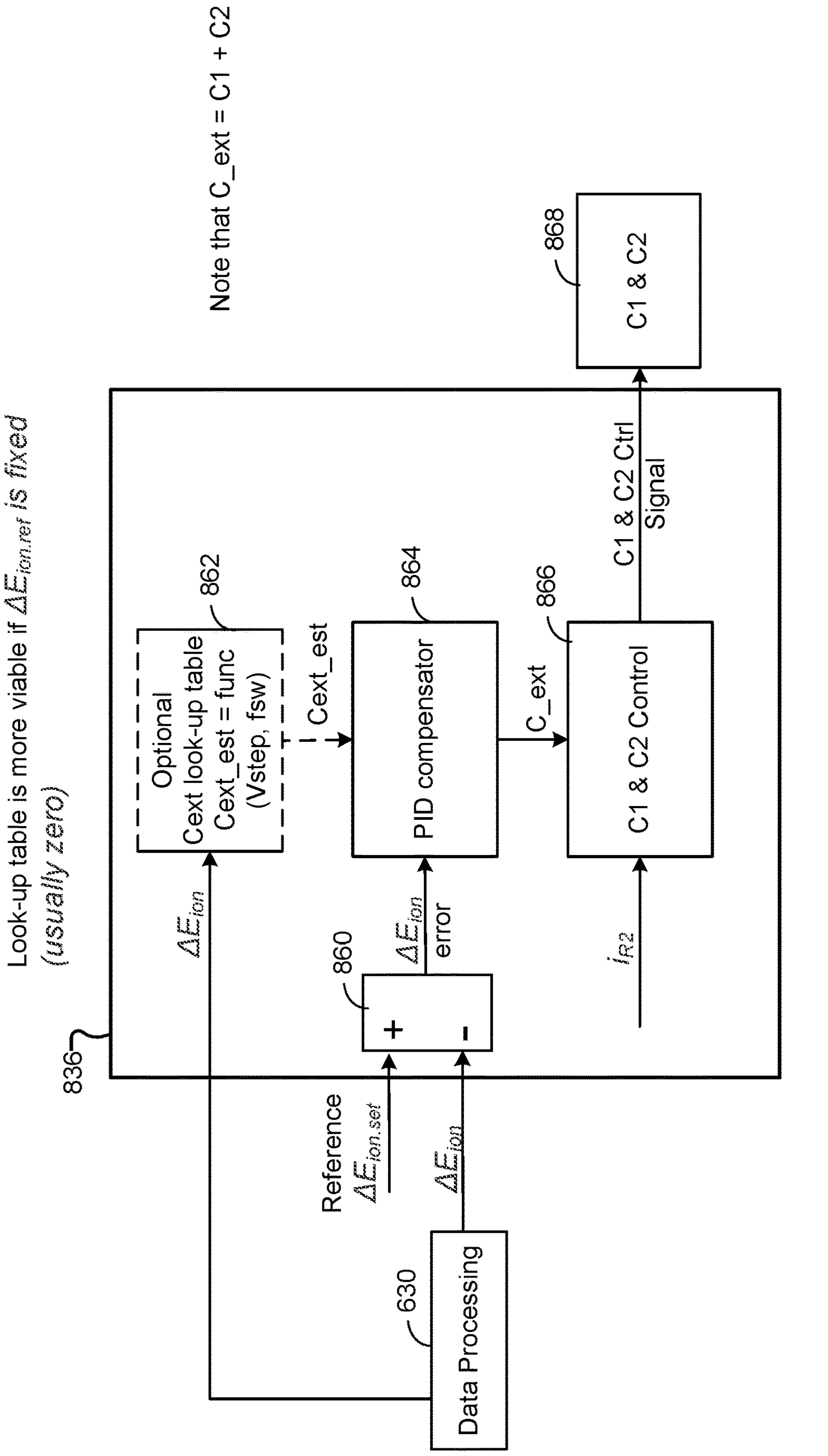
FIG. 8 is a block diagram depicting control aspects associated with a mode of operating a bias supply system.

Referring to FIG. 8, shown is a process-flow diagram depicting a method for adjusting $\Delta E_{ion}$ utilizing the variable capacitance 250. Because $\Delta E_{ion}$ affects the distribution (also referred to as a spread) of ion energies, the method conveyed by FIG. 8 may also be characterized as method for controlling a distribution of ion energies utilizing the variable capacitance 250. As shown, FIG. 8 depicts an ΔEion controller 836, which is example of the ΔEion controller 636 depicted in FIG. 6. As shown, the ΔEion controller 636 includes an optional lookup table 862, which may be used to produce an estimate, Cext_est, of a value for the variable capacitance 250 based upon a value of $\Delta E_{ion}$, which may be provided by the data processing component 630. The estimate. Cext_est, may be used by a proportional-integral-derivative (PID) compensator 864 as an initial value of the variable capacitance 250 when producing a setting for the variable capacitance 250.

Referring again to FIG. 13, shown is an example of data that may be stored in the optional lookup table 862. As shown in FIG. 13, when a desired value for $V_{step}$ is available and the operating frequency, fsw, of the bias supply 208 is known, then a value for the variable capacitance 250 may be obtained. For example, if the setpoint value for $V_{step}$ is 500 Volts and the frequency, fsw, of the bias supply is set to 500 kHz, then a value for C-ext of 1250 pF may be obtained and used (by the PID compensator 864) as a starting value for the variable capacitance 250, 650.

As shown, a comparator 860 of the $\Delta E_{ion}$ controller 836 receives the setpoint signal, ΔEion.set, and a feedback value of ΔEion and provides an error signal, $\Delta E_{ion}$ error, that is a difference between the desired setpoint (e.g., negative voltage ramp, slope of the workpiece voltage, or ion energy distribution) and a corresponding feedback value of ΔEion. In turn, the PID compensator 864 produces a setting, C-ext, for the variable capacitance 250. As those of ordinary skill in the art will appreciate, the PID compensator may be configured with a min-max limiter.

If the variable capacitance 250 comprises a single capacitor (e.g., as depicted in FIG. 3), then C-ext, may be used to set the single capacitor. But if the variable capacitance 250 comprises two variable capacitors (such as the variable capacitance 650), the capacitor controller 866 may create signals to control settings of the capacitors (such as the capacitors C1 and C2 depicted in FIG. 6). In some implementations, the capacitors are motor-controlled variable vacuum capacitors and the capacitor controller 866 provides motor-control signals (as shown in FIG. 8) to control motors for C1 and C2. But it is contemplated that the capacitors may each be a solid-state adjustable capacitor.

Figure 9:
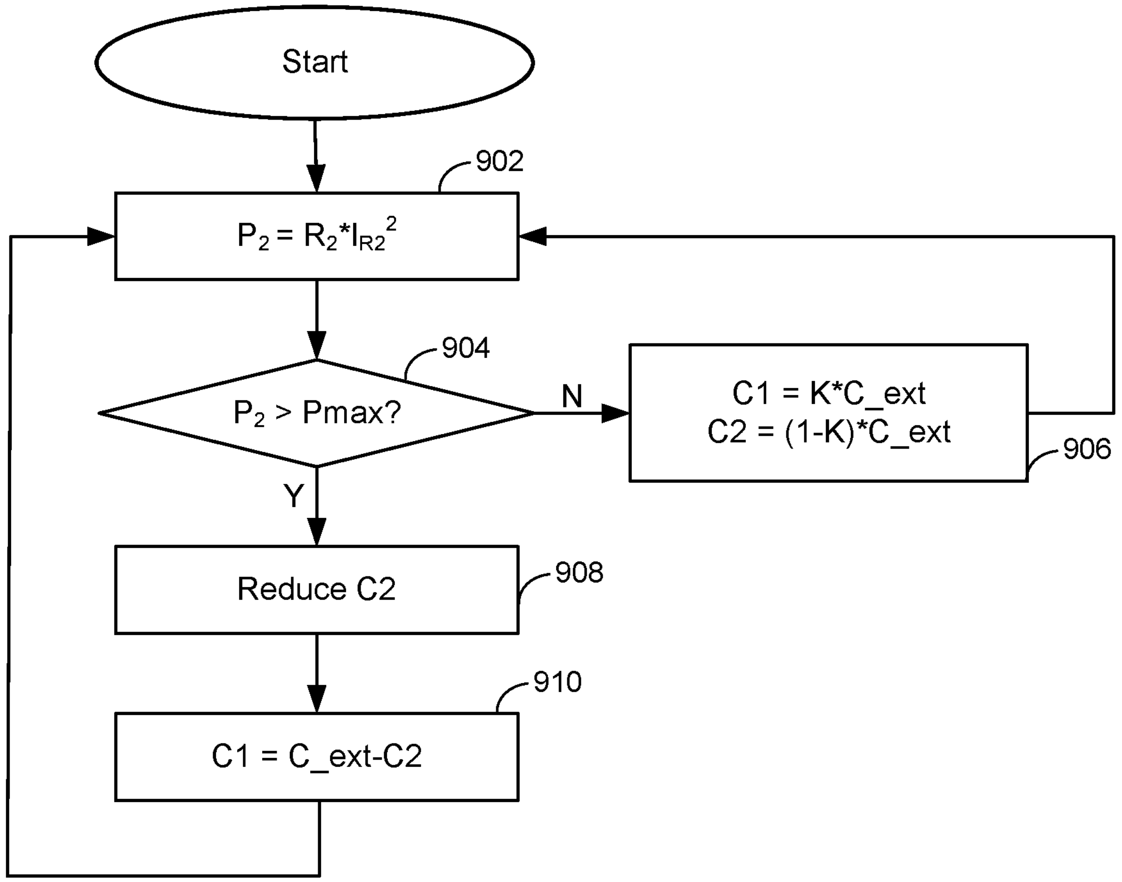
FIG. 9 is a flowchart depicting an example for controlling variable capacitors according to various aspects of the disclosure.

Referring next to FIG. 9, shown is a flowchart depicting a method for controlling the variable capacitance 650 that may be executed by the capacitor controller 866. As shown, power lost in the damping resistor, R2, is calculated as $P_2=R_2*I_{R2}^2$ (Block 902), and if the power losses, P2, exceed a threshold value of Pmax (Block 904), then a capacitance of C2 is reduced at Block 908 to reduce the amount of energy that is dissipated through the damping resistor, R2 (e.g., to limit a temperature of R2). The setting for C2 can be calculated using a simple integrator or a proportional-integrator compensator with an error input=Pmax−P2.

The capacitor C1 is then adjusted to be equal to C_ext minus C2 (Block 910). But if the power losses, P2, do not exceed a threshold value of Pmax (Block 904), then C1 is set to be equal to K*C_ext and C2 is set to be equal to (1−K)*C_ext (Block 906) where K is a programmable value that may be greater than 0.25 and less than 0.5.

Figure 10:
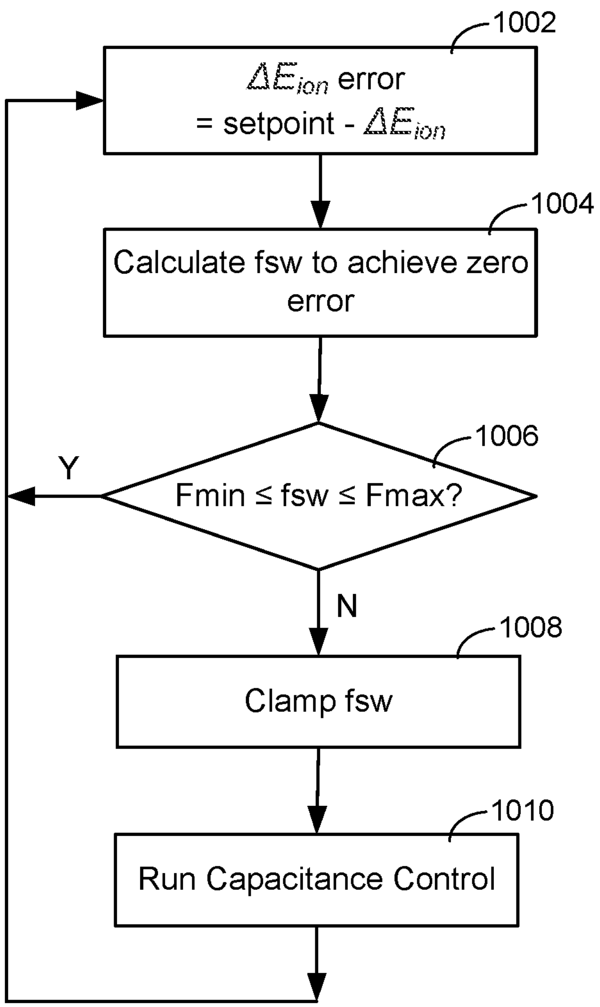
FIG. 10 is another flowchart depicting a method for controlling a variable capacitance and frequency of a bias supply system.

Referring to FIG. 10, shown is a flowchart depicting a method for controlling ΔEion utilizing both frequency of the asymmetrical periodic waveform and a capacitance of the carriable capacitance 250. In this method, an indication of an $\Delta E_{ion}$ error is obtained (Block 1002), which may be obtained by calculating $\Delta E_{ion}$_error=setpoint−$\Delta E_{ion}$. Then a frequency, fsw, of the asymmetrical voltage waveform that achieves an acceptable error level is determined (Block 1004). For example, an acceptable error may be substantially zero error.

As shown, if the frequency, fsw, of the asymmetrical voltage waveform is within a threshold range of frequencies between a minimum frequency, Fmin, and a maximum frequency, Fmax, that the bias supply system 200 can provide (Block 1006), then the value for the $\Delta E_{ion}$ error continues to be obtained at Block 1002 and the desired frequency, fsw, continues to be calculated and used as the frequency of the asymmetrical periodic voltage waveform at Block 1004. But if the calculated frequency, fsw, is outside of the range between the minimum frequency, Fmin, and the maximum frequency, Fmax, then the frequency is clamped (Block 1008) and the capacitance control algorithm described with reference to FIG. 8 is run. In general, the method depicted in FIG. 10 prioritizes controlling $\Delta E_{ion}$ with the frequency, fsw, of the asymmetric periodic voltage waveform, and when the bias supply system cannot provide the frequency, fsw, the capacitance of the variable capacitance 250 is adjusted to control $\Delta E_{ion}$.

Figure 11A:
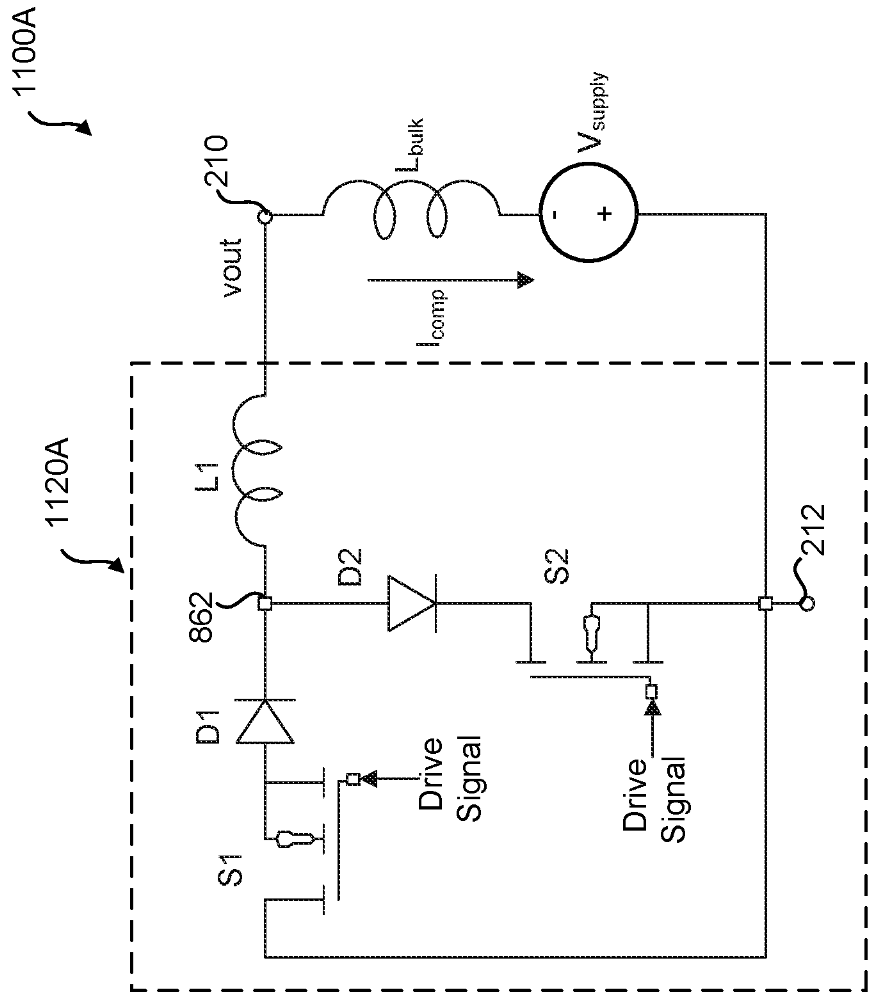
FIG. 11A is a schematic representation of a bias supply.

FIG. 11A illustrates an example topology 1100A of a bias supply, such as bias supply 208, comprising a single power supply, $V_{supply}$, and a switch network 1120A comprising two active switches, S1 and S2. In the variation depicted in FIG. 11A, a series combination of the first switch S1 and the first diode D1 is arranged between the return node 212 of the bias supply and node 862. In addition, a series combination of the second switch S2 and the second diode D2 is arranged between the node 862 and the return node 212 of the bias supply. As shown in FIG. 11A, the first diode D1 is arranged between the first switch S1 and the node 862 with its anode coupled to the first switch S1 and its cathode coupled to the node 862. The second diode D2 is arranged between the second switch S2 and the node 862 with its cathode coupled to the second switch S2 and its anode coupled to the node 862. In this arrangement, the cathode of the first diode D1, the anode of the second diode D2, and one end of the inductor L1 are coupled at the node 862, while the opposing end of the inductor is coupled to the output node 210.

In operation, first diode D1 conducts when the first switch S1 is closed, and a second diode D2 conducts when the second switch D2 is closed. And the first switch S1 and the second switch S2 are controlled as depicted in FIG. 4 to produce the asymmetric periodic voltage waveform $V_{out}$ and the output current $i_{out}$ (shown in FIG. 4). Although not depicted, it should be recognized that the position of the first switch S1 and the position of the first diode D1 may be swapped. Similarly, the position of the second switch S2 and the position of the second diode D2 may be swapped.

Figure 11B:
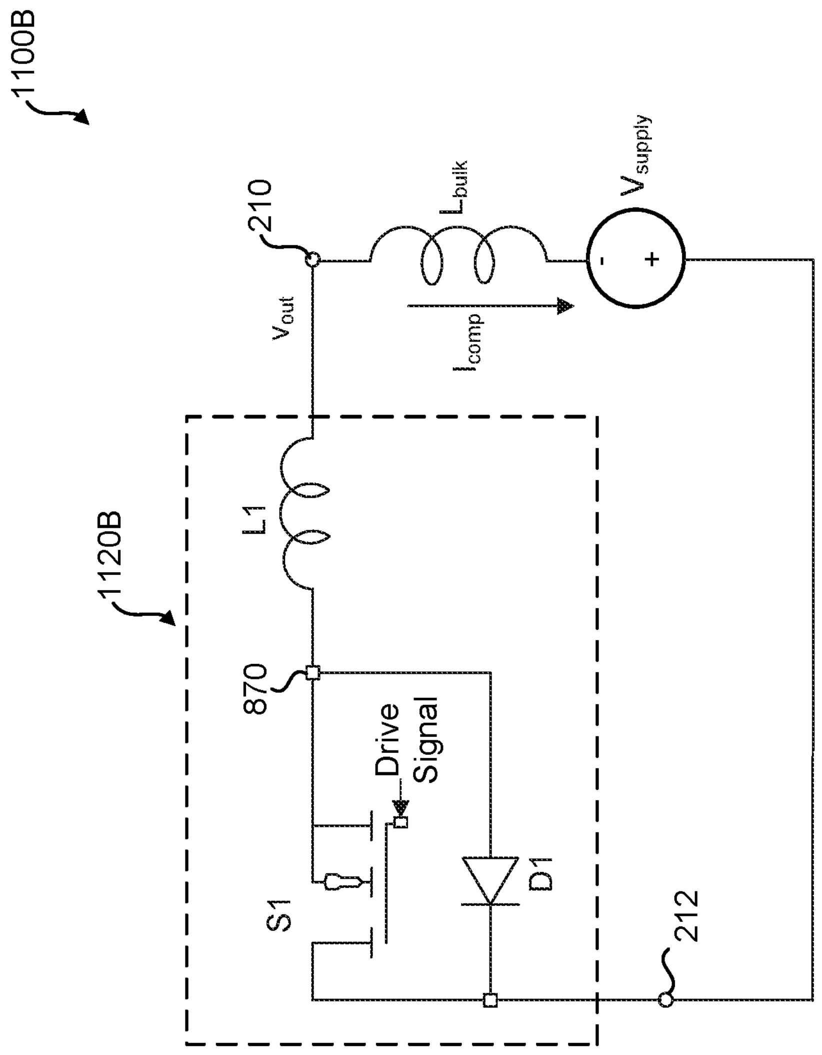
FIG. 11B is a schematic representation of another bias supply.

FIG. 11B illustrates a fourth example topology 1100B of a bias supply, such as bias supply 208, comprising a single power supply, $V_{supply}$, and a switch network 1120B having a single active switch, S1, according to various aspects of the disclosure.

In the switch network 1120B shown in FIG. 11B, a first inductor L1 is coupled between a node 870 and the output node 210, and the switch S1 is coupled between the node 870 and the return node 212. A diode D1 is coupled in parallel with the switch S1 between the node 870 and the return node 212. In operation, the switch S1 is opened and closed, as shown in FIG. 5, to produce the asymmetric periodic voltage function $V_{out}$ and the output current $i_{out}$ shown in FIG. 5. For example, an application of the asymmetric periodic voltage waveform is effectuated between the output node 210 and the return node 212 by closing the switch S1 to cause the output current $i_{out}$ to change from $-I_o$ to a peak value and back to $-I_o$. After the switch S1 is opened, the current increases to a peak value in an opposite direction and back to $-I_o$. To reduce or minimize losses, the timing parameter estimator 633 may optionally detect when the output current $i_{out}$ is reaching $I_o$ and provide a signal to the gate drive signal generator 638 to cause the switch S1 to open when the output current $i_{out}$ is at $I_o$.

In operation, the switches S1 and/or S2 described in relation to FIGS. 11A and 11B are operated as previously described to create the asymmetric periodic waveform, $v_{out}$, and the output current, $i_{out}$, depicted in FIGS. 4 and/or 5. It should be recognized that because the switch S1 and the diode D1 are arranged in series (e.g., in FIG. 11A) the order of the switch S1 and the diode D1 may be swapped. Similarly, because the switch S2 and the diode D2 are arranged in series the order of the switch S2 and the diode D2 may also be swapped.

In many implementations, the switches disclosed herein are realized by field-effect switches, such as, metal-oxide semiconductor field-effect transistors (MOSFETs). In some implementations, the switches are realized by silicon carbide metal-oxide semiconductor field-effect transistors (SiC MOSFETs) or gallium nitride metal-oxide semiconductor field-effect transistors (GaN MOSFETs). As another example, the switches may be realized by insulated gate bipolar transistors (IGBTs). In these implementations, the gate drive signal generator 638 may comprise an electrical driver known in the art that is configured to apply electrical drive signals to the switches. It is also contemplated that the drive signals may be sent via optical lines to convey optical switching signals. Additionally, the switches may switch in response to the optical signal and/or optical signals that are converted to an electrical drive signal.

It should be recognized that each of the switches depicted herein generally represents one or more switches that are capable of closing and opening to connect and disconnect, respectively, a current pathway. For example, each of the switches may be realized by a plurality of switches arranged is series (for enhanced voltage capability), may be realized by a plurality of switches arranged is parallel (for enhanced current capability), or each of the switches may be comprised of a plurality of switches arranged in a series-parallel combination (for enhanced voltage and or current capability). In these variations, one of ordinary skill in the art will recognize that each switch may be synchronously driven by a corresponding drive signal.

It should also be recognized that any of the diodes depicted herein may be realized by a plurality of diodes. For example, any diode may be realized by a plurality of series-connected diodes (to enhance voltage capability), may be realized by a plurality of diodes arranged in parallel (to enhance current capability), or may be comprised of a plurality of diodes arranged in a series-parallel combination (for enhanced voltage and or current capability).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Figure 12:
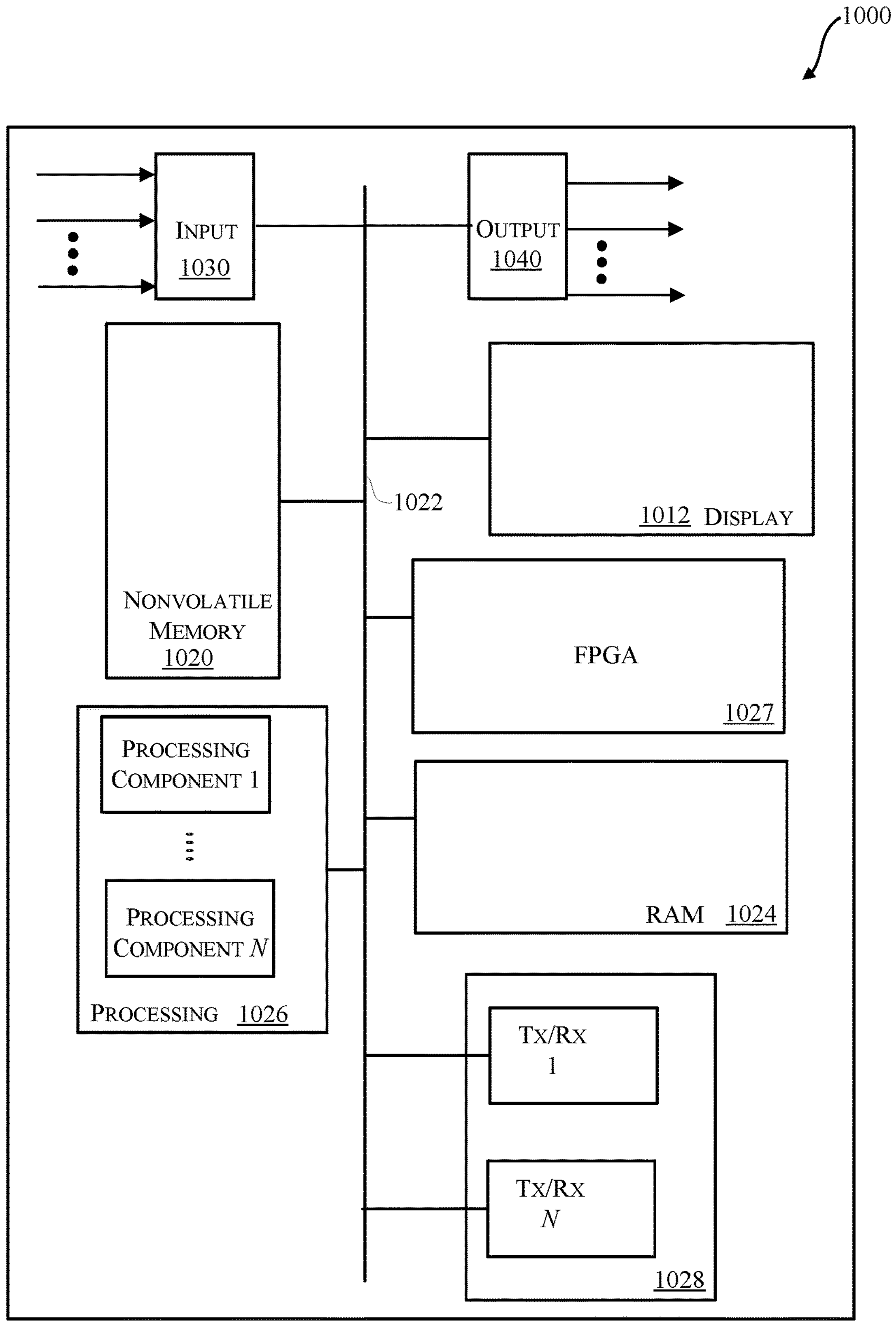
FIG. 12 illustrates a block diagram depicting components that may be utilized to implement control aspects disclosed herein, according to various aspects of the disclosure.

Many embodiments and methods described herein may be realized using a processor in connection with processor executable instructions and a field programmable gate array (programmed by hardware description language instructions). In some embodiments, the FPGA is used for high-speed processing and control, including switching control, measurement, pulsing, and multi-level operation while a processor is utilized for other lower-speed processing. Referring to FIG. 12 for example, shown is a block diagram 1000 depicting physical components of a controller that may be utilized to realize control aspects disclosed herein.

As shown, in this embodiment a display 1012 and nonvolatile memory 1020 are coupled to a bus 1022 that is also coupled to random access memory ("RAM") 1024, a processing portion (which includes N processing components) 1026, a field programmable gate array (FPGA) 1027, and a transceiver component 1028 that includes N transceivers. Although the components depicted in FIG. 12 represent physical components, FIG. 12 is not intended to be a detailed hardware diagram; thus, many of the components depicted in FIG. 12 may be realized by common constructs or distributed among additional physical components. Moreover, it is contemplated that other existing and yet-to-be developed physical components and architectures may be utilized to implement the functional components described with reference to FIG. 12.

This display 1012 generally operates to provide a user interface for a user, and in several implementations, the display is realized by a touchscreen display. In general, the nonvolatile memory 1020 is non-transitory memory that functions to store (e.g., persistently store) data and processor-executable code (including executable code that is associated with effectuating the methods described herein). In some embodiments for example, the nonvolatile memory 1020 includes bootloader code, operating system code, file system code, and non-transitory processor-executable code to facilitate the execution of a method for predicting plasma behaviors by measuring current waveform(s), e.g., during asymmetric bias waveform application.

In many implementations, the nonvolatile memory 1020 is an example of a non-transitory processor readable storage medium and may be realized by flash memory (e.g., NAND or ONENAND memory), but it is contemplated that other memory types may be utilized as well. Although it may be possible to execute the code from the nonvolatile memory 1020, the executable code in the nonvolatile memory is typically loaded into RAM 1024 and executed by one or more of the N processing components in the processing portion 1026.

The N processing components in connection with RAM 1024 generally operate to execute the instructions encoded in nonvolatile memory 1020 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 1020 and executed by the N processing components in connection with RAM 1024. As one of ordinarily skill in the art will appreciate, the processing portion 1026 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in nonvolatile memory 1020 and accessed (e.g., during boot up) to configure a field programmable gate array (FPGA) to implement the algorithms disclosed herein.

The input component 1030 may receive electrical signals (e.g., signals indicative of output current, $I_{out}$, and voltage, $V_{out}$) obtained (e.g., by current transducers, VI sensors, current transducers, and/or voltage sensors) at the output node 210 and/or return node 212 of the disclosed bias supplies 208.

Although not required, in some implementations the FPGA 1027 may sample the electrical signals and provide the digital representations of output current, $I_{out}$, and output voltage $V_{out}$. In some embodiments, the processing portion 1026 (in connection with processor-executable instructions stored in the nonvolatile memory 1020) are used to realize the functional blocks disclosed herein. But the FPGA 1027 may also be used to implement these functions. In addition, the input component 1030 may receive the synchronization signal 115. The signals received at the input component 1030 may generally include, for example, synchronization signals, power control signals to the various generators and power supply units, or control signals from a user interface. Those of ordinary skill in the art will readily appreciate that any of a variety of types of sensors such as, without limitation, directional couplers and voltage-current (VI) sensors, may be used to sample electrical parameters, such as voltage and current, and that the signals indicative of the power parameters may be generated in the analog domain and converted to the digital domain.

The output component 1040 generally operates to provide one or more analog or digital signals to effectuate the gate drive signals for opening and closing of the switches. The output component 1040 may also provide control signals to control the variable capacitance 250, 650. For example, the output component 1040 may provide the control signals to control a single capacitor C1 or more than one capacitor, such as C1 and C2 (shown in FIG. 6).

The depicted transceiver component 1028 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B and C" or "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An apparatus to produce a waveform, the apparatus comprising:

- a first node;
- a switch configured to apply a peak voltage of the waveform to the first node before a voltage step of the waveform is applied to the first node;
- a power supply coupled to the first node to apply, after the voltage step, a ramped voltage of the waveform at the first node; and
- a capacitor coupled to the first node and a second node.

2. The apparatus of claim 1, wherein the capacitor is a variable capacitor.

3. The apparatus of claim 2, wherein the capacitor comprises:

- a first variable capacitor coupled between the first node and the second node; and
- a series combination of a second capacitor and a dissipation resistor coupled between the first node and the second node.

4. The apparatus of claim 2, comprising:

- a controller configured to adjust the variable capacitor to adjust the ramped voltage.

5. The apparatus of claim 1, comprising a housing enclosing the switch, the power supply, and the capacitor.

6. A system for producing a waveform comprising:

- a bias supply configured to apply an asymmetric periodic voltage waveform to a first node, the asymmetric periodic voltage waveform comprising a peak voltage, a voltage step following the peak voltage, and a ramped voltage; and
- a capacitor coupled between the first node and a second node.

7. The system of claim 6, wherein the capacitor comprises a variable capacitor coupled between the first node and the second node.

8. The system of claim 7 comprising:

- a controller coupled to the variable capacitor, the controller configured to:
  - monitor one or more electrical parameters at the first node; and
  - control the variable capacitor to control the ramped voltage.

9. The system of claim 8, wherein the controller is configured to control the variable capacitor and a frequency of the asymmetric periodic voltage waveform to control the ramped voltage.

10. The system of claim 9, wherein the controller is configured to:

- initially adjust a frequency of the asymmetric periodic voltage waveform to control the ramped voltage; and
- adjust the variable capacitor if adjusting the frequency does not achieve a desired ramped voltage.

11. The system of claim 8, wherein the controller is configured to:

- receive a synchronization signal and set a frequency of the asymmetric periodic voltage waveform to a synchronization frequency indicated by the synchronization signal; and
- control the variable capacitor to control the ramped voltage.

12. The system of claim 6, wherein the capacitor is located outside of a housing of the bias supply.

13. The system of claim 6, wherein the capacitor is located inside of a housing of the bias supply.

14. The system of claim 6, wherein the capacitor comprises:

- a first variable capacitor coupled between the first node and the second node; and a series combination of a second capacitor and a dissipation resistor coupled between the first node and the second node.

15. The system of claim 6, wherein the bias supply comprises:

a switch configured to apply a peak voltage of the waveform to the first node before a voltage step of the waveform is applied to the first node;

a power supply coupled to the first node to apply, after the voltage step, a ramped voltage of the waveform at the first node; and a capacitor coupled to the first node and a second node.

16. The system of claim 7, comprising:

a series combination of a second capacitor and a dissipation resistor coupled between the first node and the second node.

17. The system of claim 7 comprising:

a controller coupled to the variable capacitor, the controller configured to:

monitor one or more electrical parameters at the first node; and control the variable capacitor to control the ramped voltage.

18. The system of claim 15, comprising a housing enclosing the switch and the power supply, wherein the capacitor is located outside of the housing.

19. The system of claim 15, comprising a second switch coupled to the first node via a diode, a combination of the second switch and the diode is configured to apply the voltage step.

20. The system of claim 15, wherein the switch comprises a plurality of switches configured to be synchronously driven to open and close simultaneously.

* * * * *